(12) United States Patent
Takemura et al.

(10) Patent No.: US 9,557,645 B2
(45) Date of Patent: *Jan. 31, 2017

(54) POSITIVE PHOTOSENSITIVE RESIN COMPOSITION, PHOTO-CURABLE DRY FILM AND METHOD FOR PRODUCING SAME, LAYERED PRODUCT, PATTERNING PROCESS, AND SUBSTRATE

(71) Applicant: SHIN-ETSU CHEMICAL CO., LTD., Tokyo (JP)

(72) Inventors: Katsuya Takemura, Jyoetsu (JP); Masashi Iio, Jyoetsu (JP); Hiroyuki Urano, Jyoetsu (JP); Takashi Miyazaki, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/726,909

(22) Filed: Jun. 1, 2015

(65) Prior Publication Data

US 2015/0370166 A1 Dec. 24, 2015

(30) Foreign Application Priority Data

Jun. 18, 2014 (JP) ................. 2014-125617

(51) Int. Cl.
| | |
|---|---|
| *G03F 7/039* | (2006.01) |
| *G03F 7/075* | (2006.01) |
| *G03F 7/09* | (2006.01) |
| *G03F 7/11* | (2006.01) |
| *G03F 7/20* | (2006.01) |
| *G03F 7/30* | (2006.01) |
| *G03F 7/32* | (2006.01) |
| *G03F 7/40* | (2006.01) |
| *G03F 7/022* | (2006.01) |
| *G03F 7/16* | (2006.01) |
| *G03F 7/023* | (2006.01) |

(52) U.S. Cl.
CPC ............. *G03F 7/039* (2013.01); *G03F 7/022* (2013.01); *G03F 7/0226* (2013.01); *G03F 7/0236* (2013.01); *G03F 7/0757* (2013.01); *G03F 7/09* (2013.01); *G03F 7/11* (2013.01); *G03F 7/16* (2013.01); *G03F 7/20* (2013.01); *G03F 7/30* (2013.01); *G03F 7/32* (2013.01); *G03F 7/40* (2013.01)

(58) Field of Classification Search
None
See application file for complete search history.

(56) References Cited

U.S. PATENT DOCUMENTS

| | | | |
|---|---|---|---|
| 2005/0123854 A1* | 6/2005 | Ogata | G03F 7/0757 430/270.1 |
| 2008/0182087 A1 | 7/2008 | Kato et al. | |
| 2009/0215222 A1 | 8/2009 | Arai et al. | |
| 2012/0237873 A1 | 9/2012 | Fujiwara et al. | |
| 2015/0056545 A1* | 2/2015 | Urano | C08G 77/38 430/18 |

FOREIGN PATENT DOCUMENTS

| | | |
|---|---|---|
| EP | 1186624 A1 | 3/2002 |
| EP | 2 631 259 A1 | 8/2013 |
| EP | 2 842 984 A1 | 3/2015 |
| JP | H0253057 A | 2/1990 |
| JP | H04189811 A | 7/1992 |
| JP | H06-220181 A | 8/1994 |
| JP | 2008-184571 A | 8/2008 |
| JP | 2009-200315 A | 9/2009 |
| TW | 201522430 A | 6/2015 |

OTHER PUBLICATIONS

Oct. 23, 2015 Extended Search Report issued in European Patent Application No. 15001757.2.
Mar. 21, 2016 Office Action issued in Taiwanese Patent Application No. 104119486.

* cited by examiner

*Primary Examiner* — Sin Lee
(74) *Attorney, Agent, or Firm* — Oliff PLC

(57) ABSTRACT

A positive photosensitive resin composition containing a polymer compound obtained in the presence of an acid catalyst by condensation of at least a siloxane compound shown by formula (1), a phenol compounds shown by formula (2) and/or formula (3), and aldehydes and ketones shown by formula (4), a photosensitive material capable of generating an acid by light and increasing a dissolution rate in an aqueous alkaline solution, a crosslinker, and a solvent. There can be provided a positive photosensitive resin composition that can remedy the problem of delamination generated on metal wiring, electrode, and substrate such as Cu and Al, especially on substrate SiN, and can form fine pattern having forward tapered shape without generating scum and footing profile in the pattern bottom and on the substrate when the widely used 2.38% TMAH aqueous solution is used as a developer.

21 Claims, 1 Drawing Sheet

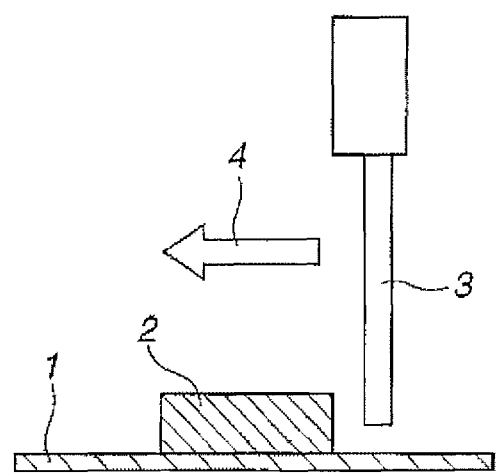

POSITIVE PHOTOSENSITIVE RESIN COMPOSITION, PHOTO-CURABLE DRY FILM AND METHOD FOR PRODUCING SAME, LAYERED PRODUCT, PATTERNING PROCESS, AND SUBSTRATE

BACKGROUND OF THE INVENTION

Field of the Invention

The present invention relates to a positive photosensitive resin composition, a photo-curable dry film produced by using the positive photosensitive resin composition, a method for producing the photo-curable dry film, a layered product having the photo-curable dry film laminated on a substrate, a patterning process using the positive photosensitive resin composition or the photo-curable dry film, and a substrate obtained by the patterning process.

Description of the Related Art

As various electronic devices including a personal computer, a digital camera, and a mobile phone progress toward downsizing and higher performance, requirements are rapidly increasing for further downsizing, thinning, and higher density in a semiconductor device. Accordingly, it is desired to develop a photosensitive insulation material that can accommodate an increase in surface area of a substrate for the sake of higher productivity, and further can accommodate structures having fine concavity and convexity with a high aspect ratio on a substrate, in high density mounting technologies including a chip size package or a chip scale package (CSP) and a three-dimensional lamination.

As the above-mentioned photosensitive insulation material, a photo-curable resin composition has been proposed (Patent Document 1), in which the composition can be applied so as to give a wide range of film thickness by a spin coating method commonly used in the semiconductor device fabrication, be processed into a fine pattern using a wide range of wavelength, and be post-cured at low temperature into a top coat having excellent flexibility, heat resistance, electric characteristics, adhesiveness, reliability, and chemical resistance to protect electric and electronic parts. The spin coating method has an advantage that a film can be readily formed on a substrate.

The above-mentioned photo-curable resin composition for providing a top coat to protect electric and electronic parts is used with a film thickness of 1 to 100 μm on a substrate. However, there is a practical limit in the photo-curable resin composition because when the film thickness exceeds about 30 μm, its viscosity becomes too high to form a film on a substrate by the spin coating method.

Also, when the photo-curable resin composition is applied onto a substrate having an uneven surface by spin coating, it is difficult to form a uniform layer on the substrate. Because of this, the photo-curable resin layer tends to generate voids on the uneven part of the substrate, and thus, further improvements in planarity and step coverage have been desired. As the alternative coating method in place of the spin coating method, a spray coating method has been proposed (Patent Document 2). However, in principle, this method tends to readily cause defects such as height difference due to unevenness of the substrate, film loss at pattern edge, and a pinhole in recess bottom, and thus, the problems of planarity and step coverage still remain unsolved.

In recent years, in the high density mounting technologies including a chip size package or a chip scale package (CSP) and a three-dimensional lamination, a technology by which a fine pattern having a high aspect ratio is formed on a substrate, followed by laminating the pattern thus obtained with a metal such as copper, whereby rewiring from a chip, is very active. As the chip advances toward higher density and integration, it is strongly desired in the rewiring technology to reduce the line width of a pattern and the size of a contact hole for connecting between substrates.

Moreover, it is necessary that a pattern used for rewiring permanently exists between device chips, and the pattern material must have a cure ability and also serve as a top coat having excellent flexibility, heat resistance, electric characteristics, adhesiveness, reliability, and chemical resistance to protect electric and electronic parts.

From the background as mentioned above, a negative resist composition was assumed to be appropriately applied to the common lithography for obtaining a fine pattern, and suitable as the composition for the patterning process capable of processing a fine rewire and forming a top coat with excellent flexibility, heat resistance, electric characteristics, adhesiveness, reliability, and chemical resistance to protect electric and electronic parts.

However, if a negative resist composition is used to form a contact hole for connecting between substrates or wires and circuits in the three-dimensional lamination, thereby constituting a through electrode, the contact hole tends to be formed in a reversed tapered shape such that the upper aperture diameter is smaller than the lower aperture diameter, or to be formed in an overhang shape such that the upper aperture is extremely small. The reversed tapered shape and the overhang shape make the metal film formation by sputtering and the metal embedding by plating difficult. The preferable shape of the contact hole constituting a through electrode is a forward tapered shape such that the upper aperture is larger than the lower aperture.

Further, it is concerned that the negative resist composition reaches a limit of resolution in accordance with a pattern miniaturization expected to further progress in future. That is, the negative resist composition may cause an undissolved residue and a scum in the pattern bottom, and a footing profile in the pattern on the substrate e.g. when thickness of the covering film formed of the resist composition on the substrate is thick. These scum and footing profile are likely to cause problems including disconnection of an electric circuit and a wire during the rewiring process, so that it is necessary to suppress generation of such problems. However, it cannot be denied that these scum and footing profile become difficult to be resolved in the negative resist composition, as the miniaturization further progresses.

On the other hand, the negative resist composition that is capable of forming a fine pattern to be used for a rewiring process and is useful for a top coat to protect electric and electronic parts occasionally covers over a Cu wiring that has been previously processed on a substrate or over an Al electrode on a substrate. In addition, the substrates provided with a wire and an electrode include an insulating substrate such as SiN, which needs to be covered widely. However, adhesiveness between these substrates and a covering layer formed of the negative resist composition is not sufficient yet, so that there often occurs a problem that the covering layer formed of the resist composition is delaminated from the substrate.

Moreover, in patterning by using the negative resist composition useful for a top coat to protect electric and electronic parts, an organic solvent is used often as a developer in development. In this case, the exposed part becomes insoluble in an organic solvent developer by a crosslinking reaction or the like, while the unexposed part is readily soluble in the organic solvent developer, thereby obtaining a pattern.

However, there is an idea that development by the organic solvent developer is not desirable in view of treatment of waste liquid after development, load to an environment, and so forth. Moreover, the organic solvent developer is so expensive that development by an aqueous alkaline solution such as a 2.38% tetramethyl ammonium hydroxide (TMAH) aqueous solution, which is cheap and widely used in lithography patterning, is preferred.

In development using an aqueous alkaline solution such as a 2.38% TMAH aqueous solution, some negative resist compositions used in recent years have small difference in solubility in the developer between the exposed part and the unexposed part. In other words, the so-called dissolution contrast therebetween is sometimes small. When the dissolution contrast is small, it cannot be always expected to form a good pattern satisfying a demand of a fine pattern. In addition, when the dissolution contrast is small, there is a fear that a pattern cannot be formed on a substrate accurately according to a mask used in transferring and forming a pattern. Therefore, the resist composition and photosensitive resin composition requires the highest dissolution contrast as possible in the use of an alkaline developer, that is, it is required to enhance resolution.

Accordingly, drastic improvement of adhesiveness on a substrate is desired while not only maintaining the fine patterning ability in the rewiring technology required in accordance with the trends to higher density and higher integration of chips but also serving as a photosensitive material useful for a top coat to protect electric and electronic parts. Also, it is desired that a contact hole for forming a through electrode connecting metal wires has a forward tapered shape. In addition, wanted is prompt building up of the system in which patterning is possible by a widely used alkaline developer such as a 2.38% TMAH aqueous solution, further improvement in resolution can be expected, and a scum and a footing profile are not generated in the pattern bottom.

PRIOR ART DOCUMENT

Patent Document

Patent Document 1: Japanese Patent Laid-Open Publication No. 2008-184571
Patent Document 2: Japanese Patent Laid-Open Publication No. 2009-200315

SUMMARY OF THE INVENTION

The present invention was accomplished in view of the above-described problems. It is an object of the present invention to provide a positive photosensitive resin composition that can remedy the problem of delamination generated on a metal wiring, an electrode, and a substrate such as Cu and Al, especially on a substrate such as SiN, and can form a fine pattern having a forward tapered shape without generating a scum and a footing profile in the pattern bottom and on the substrate when the widely used 2.38% TMAH aqueous solution is used as a developer.

Another object of the present invention is to provide a patterning process in which the above-mentioned positive photosensitive resin composition is easily applied on a substrate by using a spin coating method to form a fine pattern.

Further object of the present invention is to provide a photo-curable dry film using the positive photosensitive resin composition, a method for producing the photo-curable dry film, a layered product having the photo-curable dry film laminated on a substrate, and a patterning process in which a resist layer having a wide range of film thickness is formed by using the photo-curable dry film to form a fine pattern even on a substrate having concavity and convexity.

Furthermore, the present invention has another object to provide a substrate protected by a cured film that is obtained by post-curing a pattern obtained by the above-mentioned patterning process at low temperature.

To solve the above-mentioned problems, the present invention provides a positive photosensitive resin composition comprising:

(A) a polymer compound containing a carboxyl group and a siloxane chain;

(B) a photosensitive material capable of generating an acid by light and increasing a dissolution rate in an aqueous alkaline solution;

(C) one or more crosslinkers selected from an amino condensate modified by formaldehyde or formaldehyde-alcohol, a phenol compound having on average two or more methylol groups or alkoxymethylol groups per molecule, a polyhydric phenol compound in which a hydrogen atom of a phenolic hydroxyl group is substituted by a glycidyl group, a polyhydric phenol compound in which a hydrogen atom of a phenolic hydroxyl group is substituted by a substituent shown by the formula (C-1), and a compound having two or more nitrogen atoms bonded to a glycidyl group per molecule and shown by the formula (C-2); and (D) a solvent; wherein the component (A) is obtained in the presence of an acid catalyst by condensation of at least a siloxane compound having phenol groups at both terminals and shown by the formula (1), either or both of a phenol compound shown by the formula (2) and a phenol compound shown by the formula (3), and one or more kinds of aldehydes and ketones shown by the formula (4),

(C-1)

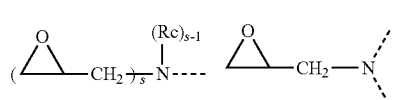

(C-2)

wherein the dotted line represents a bond; $R_c$ represents a linear, branched, or cyclic alkyl group having 1 to 6 carbon atoms; and "s" is 1 or 2,

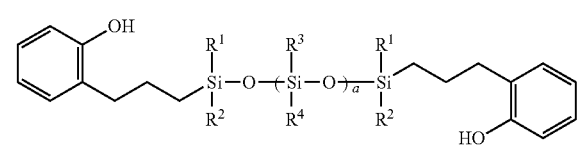

(1)

wherein $R^1$ to $R^4$ represent the same or different monovalent hydrocarbon group having 1 to 8 carbon atoms; and "a" is an integer of 1 to 100,

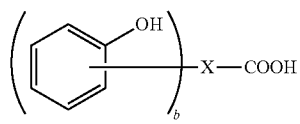
(2)

wherein "b" is 1 or 2; and X represents a divalent organic group when "b" is 1, or X represents a trivalent organic group when "b" is 2, wherein when "b" is 1, the carboxyl group may be directly bonded to the phenol group without intervention of X,

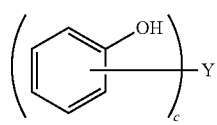
(3)

wherein "c" is 1 or 2; and Y represents a monovalent substituent selected from a hydrogen atom, an alkyl group having 1 to 6 carbon atoms, a hydroxyl group, and a halogen atom when "c" is 1, or Y represents a divalent organic group optionally containing an atom of Si, S, or O when "c" is 2,

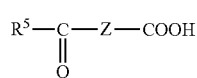
(4)

wherein $R^5$ represents a hydrogen atom or a methyl group; and Z represents an alkylene group having 1 to 12 carbon atoms, or an aromatic group.

Such a positive photosensitive resin composition can remedy the problem of delamination generated on a metal wiring, an electrode, and a substrate such as Cu and Al, especially on a substrate such as SiN, and can form a fine pattern having a forward tapered shape without generating a scum and a footing profile in the pattern bottom and on the substrate when the widely used 2.38% TMAH aqueous solution is used as a developer.

Moreover, the component (A) is preferably obtained in the presence of the acid catalyst by condensation by further adding one or more kinds of aldehydes and ketones shown by the formula (5),

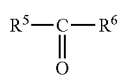
(5)

wherein $R^5$ represents the same meaning as above; and $R^6$ represents a hydrogen atom, an alkyl group having 1 to 15 carbon atoms, or an aromatic group, wherein $R^5$ and $R^6$ may be connected by an alkylene group having 1 to 15 carbon atoms.

By further adding one or more kinds of aldehydes and ketones shown by the formula (5), the effects of the present invention can be further enhanced.

The siloxane compound having phenol groups at both terminals and shown by the formula (1) is preferably a compound shown by the formula (6),

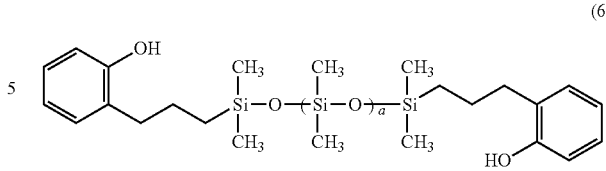
(6)

wherein "a" represents the same meaning as above.

Such a compound is easily synthesized. Also, when this compound is contained in the raw materials for the component (A) of the positive photosensitive resin composition of the present invention, the solubility in a developer is not reduced during the patterning using an aqueous alkaline solution such as a 2.38% TMAH aqueous solution as a developer.

The phenol compound shown by the formula (2) is preferably any of compounds shown by the formulae (7).

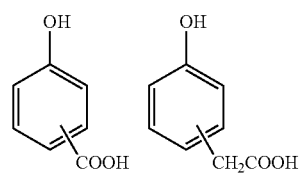

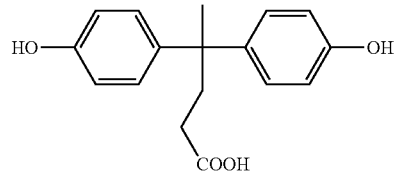

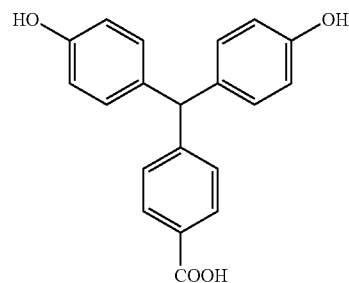
(7)

Moreover, the phenol compound shown by the formula (3) is preferably a compound shown by the formula (8),

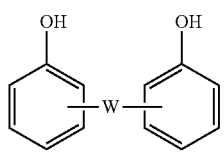
(8)

wherein W represents a divalent organic group having any of structures shown by the formulae (9),

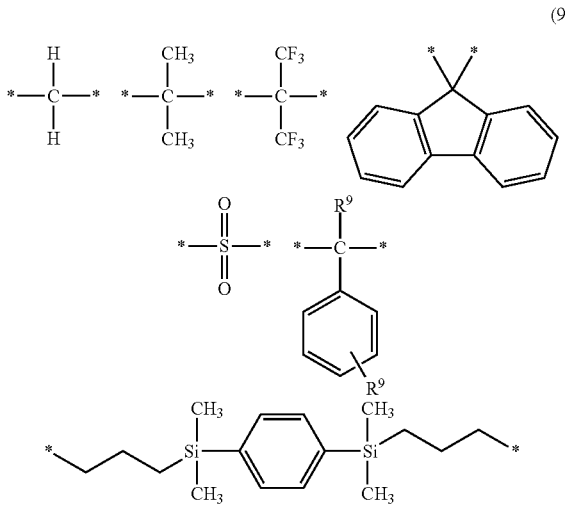

(9)

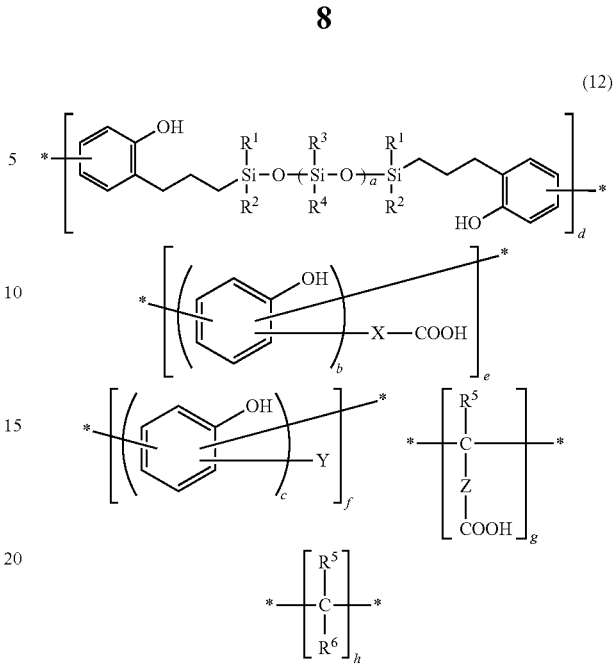

(12)

wherein $R^8$ represents a monovalent substituent selected from a hydrogen atom, an alkyl group having 1 to 6 carbon atoms, a hydroxyl group, and a halogen atom; and $R^9$ represents a hydrogen atom or a methyl group.

The above-mentioned phenol compounds are suitably blended in the raw materials for the component (A) of the positive photosensitive resin composition of the present invention.

Further, one of the aldehydes and the ketones shown by the formula (4) is preferably a compound shown by the formula (10).

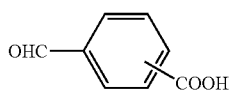

(10)

Moreover, one of the aldehydes and the ketones shown by the formula (5) is preferably a compound shown by the formula (11),

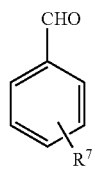

(11)

wherein $R^7$ represents a hydrogen atom, an alkyl group having 1 to 6 carbon atoms, or a halogen atom.

The above-mentioned aldehydes and ketones are suitably blended in the raw materials for the component (A) of the positive photosensitive resin composition of the present invention.

In particular, one of the aldehydes and the ketones shown by the formula (5) is preferably formaldehyde.

Further, the component (A) preferably has a repeating unit shown by the formula (12) and weight average molecular weight in the range of 3,000 to 500,000, wherein $R^1$ to $R^5$, "a", "b", "c", X, and Y represent the same meanings as above; $R^6$ represents a hydrogen atom, an alkyl group having 1 to 15 carbon atoms, or an aromatic group, wherein $R^5$ and $R^6$ may be connected by an alkylene group having 1 to 15 carbon atoms; "d" and "g" represent a positive number; "e", "f", and "h" represent 0 or a positive number; and d+e+f+g+h=1.

Such a component (A) has a suitable viscosity. Thus, a positive photosensitive resin composition and a photo-curable resin layer of a photo-curable dry film can have a suitable viscosity if this component is used therein.

Also, it is preferred that in the formula (12), "d" represent 0<d≤0.5, "e" represent 0≤e≤0.3, "g" represent 0<g<0.8, and "h" represent 0≤h≤0.5.

When such a component (A) is used in the positive photosensitive resin composition, the positive photosensitive resin composition shows a suitable solubility in a developer during the patterning using an aqueous alkaline solution such as a 2.38% TMAH aqueous solution as the developer. Therefore, even if a positive photosensitive resin composition film to cover a substrate is thick, occurrence of the pattern deterioration such as an undissolved residue and a scum in the pattern bottom, and a footing profile in the pattern on the substrate can be suppressed, so that an excellent pattern can be obtained. In addition, when such a component (A) is used in a photo-curable dry film, processability thereof is not deteriorated because the formed film shows appropriate adhesiveness.

Further, the component (B) is preferably a compound having a 1,2-naphthoquinone diazide sulfonyl group.

Such a compound is suitable as the photosensitive material of the component (B) used in the positive photosensitive resin composition of the present invention.

Also, the present invention provides a photo-curable dry film comprising a supporting film, a top coat film, and a photo-curable resin layer having a film thickness of 10 to 100 μm, the photo-curable resin layer being sandwiched between the supporting film and the top coat film, wherein the photo-curable resin layer is formed of the above-mentioned positive photosensitive resin composition.

Such a photo-curable dry film can form a fine pattern in wide ranges of film thickness and wavelength, and can give a cured film having excellent flexibility, heat resistance, electric characteristics, adhesiveness, reliability, chemical resistance, crack resistance, and fill-up performance by post-curing at low temperature.

Also, the present invention provides a method for producing a photo-curable dry film, comprising:
(i) continuously applying the above-mentioned positive photosensitive resin composition onto a supporting film to form a photo-curable resin layer,
(ii) continuously drying the photo-curable resin layer, and further
(iii) laminating a top coat film onto the photo-curable resin layer.

Such a method for producing a photo-curable dry film enables a photo-curable dry film with a high quality to be produced.

Also, the present invention provides a layered product comprising a substrate including a trench and/or a hole each having an aperture width in the range of 10 to 100 μm and a depth in the range of 10 to 120 μm, and the photo-curable resin layer of the above-mentioned photo-curable dry film laminated on the substrate.

When such a layered product is employed, the pattern can be adequately embedded therein. Further, the layered product is excellent in various properties.

Also, the present invention provides a patterning process comprising:
applying the above-mentioned positive photosensitive resin composition onto a substrate to form a photosensitive resin film,
exposing the photosensitive resin film to a high energy beam having a wavelength of 190 to 500 nm or an electron beam via a photomask after heat treatment, and
development by using a developer.

Such a patterning process can remedy the problem of delamination generated on a metal wiring, an electrode, and a substrate such as Cu and Al, especially on a substrate such as SiN, and can form a fine pattern having a forward tapered shape without generating a scum and a footing profile in the pattern bottom and on the substrate when the widely used 2.38% TMAH aqueous solution is used as a developer. Also, applying the positive photosensitive resin composition can be performed by a spin coating method.

Also, the present invention provides a patterning process comprising:
adhering onto a substrate the photo-curable resin layer which becomes exposed by delaminating the top coat film from the above-mentioned photo-curable dry film,
exposing the photo-curable resin layer to a high energy beam having a wavelength of 190 to 500 nm or an electron beam via a photomask under the state of intervention of the supporting film or under the state of the supporting film delaminated, and
development by using a developer.

Such a patterning process can remedy the problem of delamination generated on a metal wiring, an electrode, and a substrate such as Cu and Al, especially on a substrate such as SiN, and can form a fine pattern having a forward tapered shape without generating a scum and a footing profile in the pattern bottom and on the substrate when the widely used 2.38% TMAH aqueous solution is used as a developer.

At this time, it is preferred that the patterning process further comprise post-curing a patterned film formed by the development at 100 to 250° C. after the development.

The cured film thus obtained has excellent flexibility, adhesiveness to a substrate, heat resistance, electric characteristics, mechanical strength, and chemical resistance to a soldering flux liquid, and thus, a semiconductor device having the cured film like this as the top coat has superior reliability, and especially, generation of a crack during a thermal cycle test can be prevented.

At this time, the substrate may include a trench and/or a hole each having an aperture width in the range of 10 to 100 μm and a depth in the range of 10 to 120 μm.

When the photo-curable dry film of the present invention is used, a resist film having a wide range of film thickness can be formed even on the substrate having concavity and convexity, so that a fine pattern having a forward tapered shape can be formed.

Also, the present invention provides a substrate which is protected by a film obtained by curing a pattern formed by the above-mentioned patterning process.

Such a substrate is protected by the cured film having excellent flexibility, heat resistance, electric characteristics, adhesiveness, reliability, chemical resistance, crack resistance, and fill-up performance.

As mentioned above, the present invention can provide a positive photosensitive resin composition that can dramatically remedy the problem of delamination generated on a metal wiring, an electrode, and a substrate such as Cu and Al, especially on a substrate such as SiN. By using this positive photosensitive resin composition, a fine pattern having a forward tapered shape can be formed without generating a scum and a footing profile in a wide range of wavelength; and in addition, miniaturization of the pattern is possible in the rewiring technology in accordance with the tends to higher density and higher integration of chips. Moreover, this positive photosensitive resin composition can be developed by an aqueous alkaline solution such as a TMAH aqueous solution, thereby providing a photo-curable dry film using the positive photosensitive resin composition, and a patterning process using these. When the pattern formed by the patterning process like this is post-cured at low temperature, a substrate protected by a cured film having excellent flexibility, heat resistance, electric characteristics, adhesiveness, reliability, chemical resistance, crack resistance, and fill-up performance can be obtained. That is, the positive photosensitive resin composition of the present invention and the photo-curable dry film using the same can give a top coat suitable to protect electric and electronic parts, a semiconductor device, and so on.

Further, the pattern formed by the positive photosensitive resin composition of the present invention or the photo-curable dry film using the same has excellent resolution, is suitable to form a fine through electrode, and can be formed into a forward tapered shape, which is a suitable shape for a through electrode. Therefore, it is useful to form a fine electrode for connecting circuits and wires.

BRIEF DESCRIPTION OF THE DRAWINGS

FIG. 1 is an explanatory view of the adhesiveness measurement method in Examples.

DETAILED DESCRIPTION OF THE PREFERRED EMBODIMENTS

As mentioned above, drastic improvement of adhesiveness on a substrate is desired while not only maintaining the fine patterning ability in the rewiring technology required in accordance with the trends to higher density and higher integration of chips but also serving as a photosensitive material useful for a top coat to protect electric and electronic parts. In addition, wanted is a prompt build-up of a system in which patterning is possible by a widely used alkaline developer such as a 2.38% TMAH aqueous solution, further improvement of resolution can be expected, and a scum and a footing profile are not generated in the pattern bottom.

The present inventors have earnestly investigated to achieve the above object, and consequently found that a positive photosensitive resin composition including the following components (A) to (D), in which the component (A) of the polymer compound containing a carboxyl group and a siloxane chain is used as a base resin, could form a fine pattern and dramatically remedy the problem of delamination generated on a metal wiring, an electrode, and a substrate such as Cu and Al, especially on a substrate such as SiN. In addition, they found that a cured film obtained by the patterning process using the positive photosensitive resin composition like this was excellent as a top coat to protect electric and electronic parts, thereby bringing the present invention to completion.

That is, the present invention is a positive photosensitive resin composition comprising:
(A) a polymer compound containing a carboxyl group and a siloxane chain;
(B) a photosensitive material capable of generating an acid by light and increasing a dissolution rate in an aqueous alkaline solution;
(C) one or more crosslinkers selected from an amino condensate modified by formaldehyde or formaldehyde-alcohol, a phenol compound having on average two or more methylol groups or alkoxymethylol groups per molecule, a polyhydric phenol compound in which a hydrogen atom of a phenolic hydroxyl group is substituted by a glycidyl group, a polyhydric phenol compound in which a hydrogen atom of a phenolic hydroxyl group is substituted by a substituent shown by the formula (C-1), and a compound having two or more nitrogen atoms bonded to a glycidyl group per molecule and shown by the formula (C-2); and
(D) a solvent; wherein
the component (A) is obtained in the presence of an acid catalyst by condensation of at least a siloxane compound having phenol groups at both terminals and shown by the formula (1), either or both of a phenol compound shown by the formula (2) and a phenol compound shown by the formula (3), and one or more kinds of aldehydes and ketones shown by the formula (4).

Hereinafter, the present invention will be described in detail, but the present invention is not limited to these.
<Positive Photosensitive Resin Composition>

The component (A) of the polymer compound containing a carboxyl group and a siloxane chain serves as a base resin in the positive photosensitive resin composition of the present invention. The component (A) is a resin capable of dissolving in an aqueous alkaline solution since it contains a carboxyl group. By blending the component (B) of the photosensitive material capable of generating an acid by light and increasing the dissolution rate in an aqueous alkaline solution into the component (A) of the polymer compound, the solubility in an aqueous alkaline solution before exposure is suppressed due to effect of dissolution inhibition by the component (B), and thus the system becomes alkali insoluble. On the other hand, once exposure is carried out, the component (B) of the photosensitive material generates an acid and increases the dissolution rate. In this case, the system becomes alkali soluble, since the component (A) of the polymer compound is a resin capable of dissolving in an aqueous alkaline solution as mentioned above.

That is, when an aqueous alkaline solution is used as a developer, the exposed part dissolves in the developer while the unexposed part does not dissolve therein, whereby a positive pattern can be formed.

The component (C) of the crosslinker does not react in the exposure. The component (C) serves to make the crosslinking reaction progress by post-curing at 100 to 250° C. after patterning, thereby providing preferable characteristics for a top coat to protect electric and electronic parts.

Next, each of the components in the positive photosensitive resin composition of the present invention is described in more detail.
[Component (A)]

The component (A) constituting a base resin of the positive photosensitive resin composition of the present invention is a polymer compound containing a carboxyl group and a siloxane chain. The component (A) is obtained in the presence of an acid catalyst by condensation of at least a siloxane compound having phenol groups at both terminals and shown by the formula (1), either or both of a phenol compound shown by the formula (2) and a phenol compound shown by the formula (3), and one or more kinds of aldehydes and ketones shown by the formula (4).

Hereinafter, the respective components used as the material of the component (A) will be described.

First, the siloxane compound having phenol groups at both terminals and shown by the formula (1) is described,

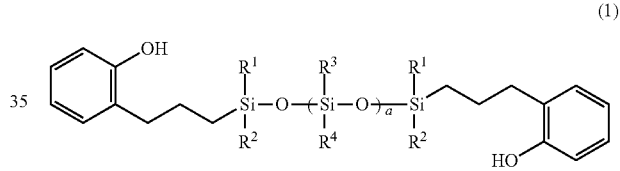

wherein $R^1$ to $R^4$ represent the same or different monovalent hydrocarbon group having 1 to 8 carbon atoms; and "a" is an integer of 1 to 100.

$R^1$ to $R^4$ in the formula (1) represent the same or different monovalent hydrocarbon group having 1 to 8, preferably 1 to 6 carbon atoms. Illustrative examples thereof include linear, branched, or cyclic alkyl groups such as a methyl group, an ethyl group, a propyl group, an isopropyl group, a n-butyl group, a tert-butyl group, and a cyclohexyl group; linear, branched, or cyclic alkenyl groups such as a vinyl group, an allyl group, a propenyl group, a butenyl group, a hexenyl group, and a cyclohexenyl group; aryl groups such as a phenyl group and a tolyl group; and aralkyl groups such as a benzyl group and a phenethyl group.

In view of easy synthesis and the like, the most preferable hydrocarbon group of $R^1$ to $R^4$ is a methyl group. The siloxane compound having a methyl group as $R^1$ to $R^4$ is shown by the formula (6),

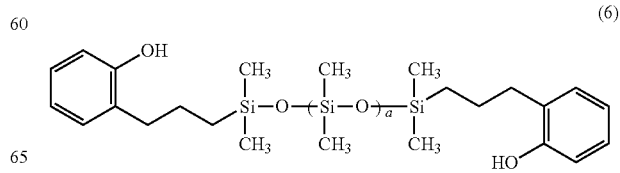

wherein "a" represents the same meaning as above.

If $R^1$ to $R^4$ have more than 8 carbon atoms, it is feared that the component becomes difficult to dissolve in the alkaline developer in patterning using an aqueous alkaline solution as a developer.

"a" in the formula (1) is an integer of 1 to 100, preferably an integer of 1 to 40, more preferably an integer of 10 to 40. If "a" exceeds 100, it is feared that the component becomes difficult to dissolve in the alkaline developer in patterning using an aqueous alkaline solution as a developer. In addition, if "a" exceeds 100, it is feared that the film to be formed exhibits extremely high adhesiveness, whereby its processability is deteriorated, and when a photo-curable dry film having a structure that the photo-curable resin layer is sandwiched between a supporting film and a top coat film is produced, the top coat film cannot be detached, and therefore it cannot be used as the photo-curable dry film. On the other hand, if "a" is less than 1, it is feared that electric characteristics that are important for a top coat to protect electric and electronic parts cannot be provided, and the film cannot exhibit flexibility that is necessary for a top coat.

The siloxane compound having phenol groups at both terminals and shown by the formula (1) can be readily obtained by general hydrosilylation reaction in which a siloxane compound having SiH groups at both terminals as shown by the formula (13) is reacted with 2-allylphenol shown by the formula (14) in the presence of a platinum catalyst.

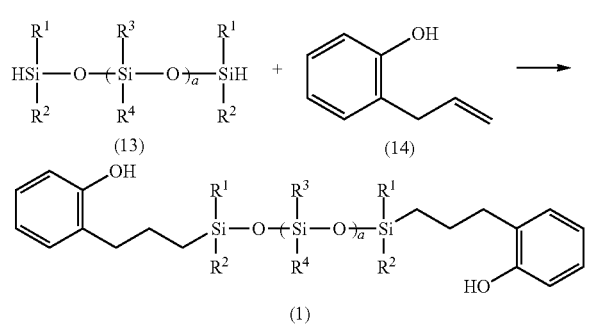

Next, the phenol compound shown by the formula (2) is described,

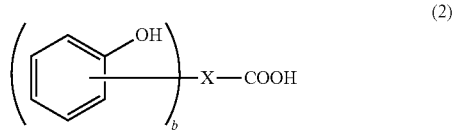

wherein "b" is 1 or 2; and X represents a divalent organic group when "b" is 1, or X represents a trivalent organic group when "b" is 2, wherein when "b" is 1, the carboxyl group may be directly bonded to the phenol group without intervention of X.

Illustrative examples of the compound shown by the formula (2) in which "b" is 1 and the carboxyl group is directly bonded with the phenol group without intervention of X include salicylic acid, 3-hydroxybenzoic acid, and 4-hydroxybenzoic acid.

Illustrative examples of the compound shown by the formula (2) in which "b" is 1 and X is a divalent organic group include, in the case that X is —$CH_2$—, 2-hydroxyphenylacetic acid, 3-hydroxyphenylacetic acid, and 4-hydroxyphenylacetic acid, and in the case that X is —$CH_2CH_2$—, 3-(2-hydroxyphenyl)propionic acid and 3-(4-hydroxyphenyl)propionic acid.

The compound shown by the formula (2) in which "b" is 2 and X is a trivalent organic group may be exemplified by the compound shown by the formulae (7').

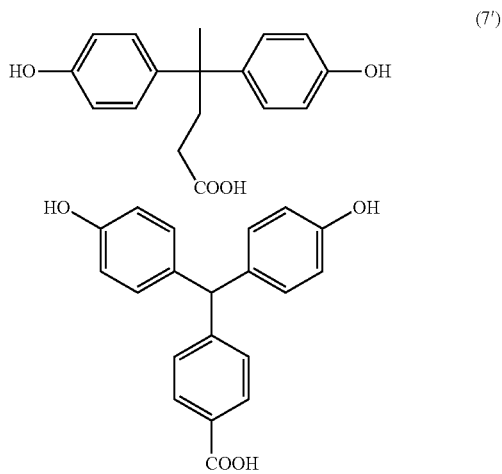

Next, the phenol compound shown by the formula (3) is described,

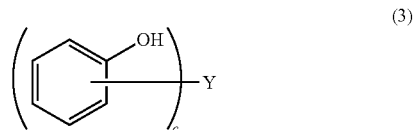

wherein "c" is 1 or 2; and Y represents a monovalent substituent selected from a hydrogen atom, an alkyl group having 1 to 6 carbon atoms, a hydroxyl group, and a halogen atom when "c" is 1, or Y represents a divalent organic group optionally containing an atom of Si, S, or O when "c" is 2.

In the formula (3), when "c" is 1, Y represents a monovalent substituent selected from a hydrogen atom, an alkyl group having 1 to 6 carbon atoms, a hydroxyl group, and a halogen atom. Preferable examples of the alkyl group include a methyl group, an ethyl group, a n-propyl group, an isopropyl group, a n-butyl group, a tert-butyl group, and a n-hexyl group.

In the formula (3), when "c" is 2, Y represents a divalent organic group optionally containing an atom of Si, S, or O. That is, the compound shown by the formula (3) may be exemplified by a compound shown by the formula (8),

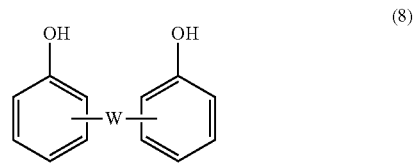

wherein W represents a divalent organic group having any of structures shown by the formulae (9), (9)

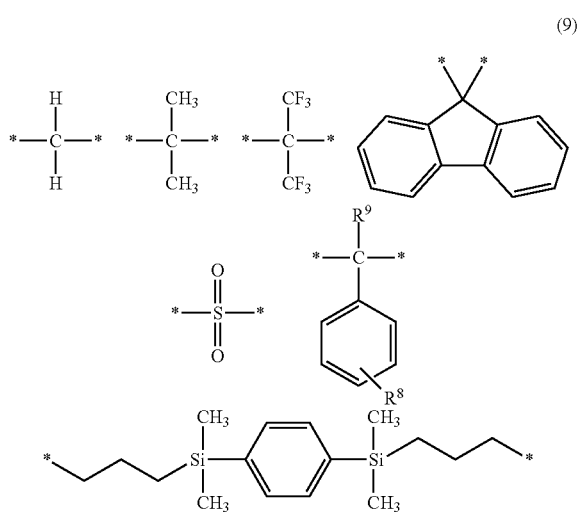

wherein $R^8$ represents a monovalent substituent selected from a hydrogen atom, an alkyl group having 1 to 6 carbon atoms, a hydroxyl group, and a halogen atom; and $R^9$ represents a hydrogen atom or a methyl group.

Among the compounds shown by the formula (8), the compound shown below is particularly preferable.

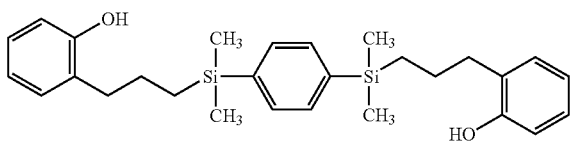 [SMILES: C[Si](C)(CCCc1ccccc1O)c1ccc([Si](C)(C)CCCc2ccccc2O)cc1]

The raw materials for the component (A) may include either of the phenol compound shown by the formula (2) or the phenol compound shown by the formula (3), or both of them.

Next, the aldehydes and ketones shown by the formula (4) are described,

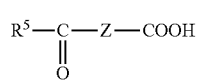
(4)

wherein $R^5$ represents a hydrogen atom or a methyl group; and Z represents an alkylene group having 1 to 12 carbon atoms, or an aromatic group.

Illustrative examples of the aldehydes and the ketones include compounds shown below.

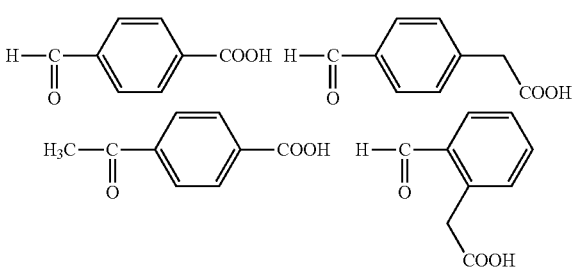

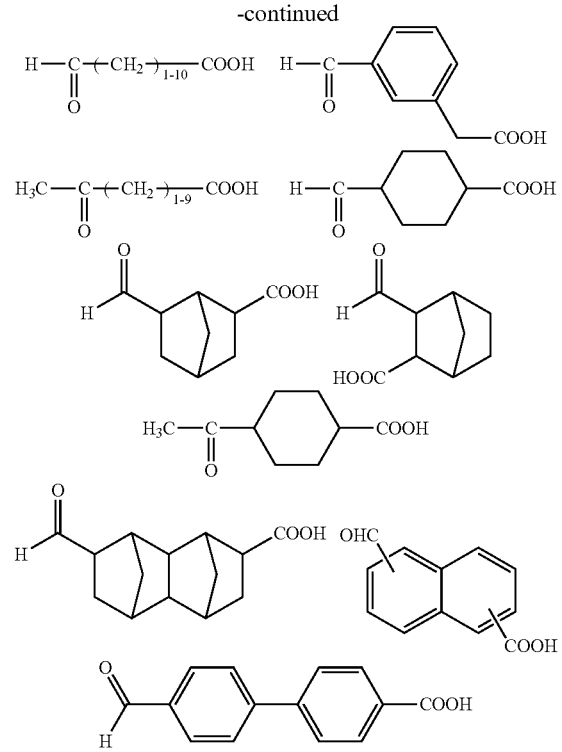

Among these compounds, the compound show by the formula (10) is particularly preferably used.

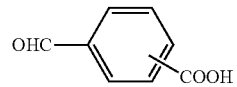
(10)

These aldehydes and ketones shown by the formula (4) may be used solely or as a mixture of two or more kinds.

In addition, it is preferable to further add one or more kinds of aldehydes and ketones shown by the formula (5),

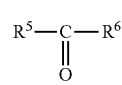
(5)

wherein $R^5$ represents the same meaning as above; and $R^6$ represents a hydrogen atom, an alkyl group having 1 to 15 carbon atoms, or an aromatic group, wherein $R^5$ and $R^6$ may be connected by an alkylene group having 1 to 15 carbon atoms.

$R^6$ in the formula (5) represents a hydrogen atom, an alkyl group having 1 to 15 carbon atoms, or an aromatic group. Illustrative examples thereof include formaldehyde, acetaldehyde, propionaldehyde, butylaldehyde, isobutylaldehyde, cyclohexane carboxaldehyde, benzaldehyde, 4-hydroxybenzaldehyde, 3-hydroxybenzaldehyde, acetone, acetophenone, and 2-butanone. In addition, $R^5$ and $R^6$ may be connected by an alkylene group having 1 to 15 carbon atoms, and illustrative examples thereof include cyclopentanone, cyclohexanone, cycloheptanone, indanone, and fluorenone.

Among them, formaldehyde and a benzaldehyde derivative shown by the formula (11) are particularly preferable,

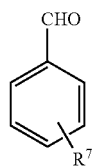
(11)

wherein $R^7$ represents a hydrogen atom, an alkyl group having 1 to 6 carbon atoms, or a halogen atom.

These aldehydes and ketones shown by the formula (5) may be used solely or as a mixture of two or more kinds.

The polymer compound containing a carboxyl group and a siloxane chain, which is the component (A) contained in the positive photosensitive resin composition of the present invention, is obtained in the presence of an acid catalyst by condensation of at least a siloxane compound having phenol groups at both terminals and shown by the formula (1), either or both of a phenol compound shown by the formula (2) and a phenol compound shown by the formula (3), and one or more kinds of aldehydes and ketones shown by the formula (4). Also, as mentioned above, it is preferable to carry out the condensation in the presence of the acid catalyst by further adding one or more kinds of aldehydes and ketones shown by the formula (5).

In general, the polymer compound of the component (A) can be readily obtained by carrying out condensation reaction (e.g. dehydration condensation) of the above-mentioned corresponding compounds without a solvent or in a solvent by using an acid at room temperature or, if necessary, under cooling or heating.

Illustrative examples of the solvent used in the condensation reaction include alcohols such as methanol, ethanol, isopropyl alcohol, butanol, ethylene glycol, propylene glycol, diethylene glycol, glycerol, methyl cellosolve, ethyl cellosolve, butyl cellosolve, and propylene glycol monomethyl ether; ethers such as diethyl ether, dibutyl ether, diethylene glycol diethyl ether, diethylene glycol dimethyl ether, tetrahydrofuran, and 1,4-dioxane; chlorinated solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, and isobutyl methyl ketone; esters such as ethyl acetate, n-butyl acetate, and propylene glycol methyl ether acetate; lactones such as γ-butyrolactone; and non-protic polar solvents such as dimethyl sulfoxide, N,N-dimethylformamide, and hexamethylphosphoric triamide; and these solvents may be used solely or as a mixture of two or more kinds. These solvents may be used with an amount in the range of 0 to 2,000 parts by mass based on 100 parts by mass of the raw materials of the reaction.

Illustrative examples of the acid catalyst to be used in the condensation reaction include inorganic acids such as hydrochloric acid, hydrobromic acid, sulfuric acid, nitric acid, phosphoric acid, boric acid, and heteropolyacid; organic acids such as oxalic acid, trifluoroacetic acid, methanesulfonic acid, benzenesulfonic acid, p-toluenesulfonic acid, and trifluoromethanesulfonic acid; and Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromide, titanium(IV) methoxide, titanium (IV) ethoxide, titanium(IV) isopropoxide, and titanium(IV) oxide.

The polymer compound containing a carboxyl group and a siloxane chain of the component (A) that is obtained by the condensation reaction as mentioned above can be shown by the formula (12),

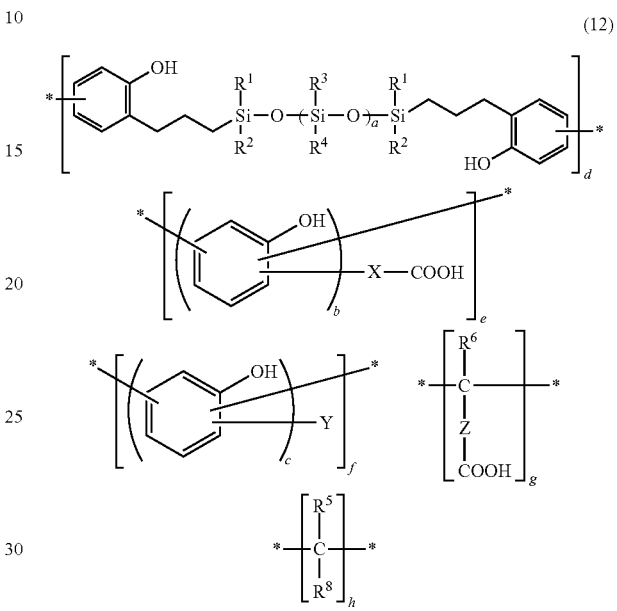
(12)

wherein $R^1$ to $R^5$, "a", "b", "c", X, and Y represent the same meanings as above; $R^6$ represents a hydrogen atom, an alkyl group having 1 to 15 carbon atoms, or an aromatic group, wherein $R^5$ and $R^6$ may be connected by an alkylene group having 1 to 15 carbon atoms; "d" and "g" represent a positive number; "e", "f", and "h" represent 0 or a positive number; and d+e+f+g+h=1.

In this case, "d" is preferably in the range of 0<d≤0.5, more preferably 0<d≤0.3. If "d" is 0.5 or less, the solubility in a developer is not reduced in the patterning using an aqueous alkaline solution as a developer, so that this range is preferable. In addition, if "d" is 0.5 or less, adhesiveness of the film to be formed is appropriate. Therefore, processability thereof is not deteriorated, and when a photo-curable dry film having a structure that a photo-curable resin layer is sandwiched between a supporting film and a top coat film is produced, the top coat film is readily detached, so that the range is preferable.

"e" is preferably in the range of 0≤e≤0.3.

"g" is preferably in the range of 0<g<0.8, more preferably 0<g<0.5, much more preferably 0.3<g<0.5. If "g" is more than 0, the solubility in a developer is not reduced in the patterning using an aqueous alkaline solution such as a 2.38% TMAH aqueous solution as a developer, and thus, a good pattern can be obtained. In other words, even if the positive photosensitive resin composition film to cover the substrate is thick, occurrence of the pattern deterioration such as an undissolved residue and a scum in the pattern bottom, and a footing profile in the pattern on the substrate can be suppressed. Also, if "g" is less than 0.8, the solubility in an alkaline developer is appropriate. Therefore, the problem that a pattern cannot be obtained because the unexposed part has been dissolved can be overcome.

"h" is preferably in the range of 0≤h≤05, more preferably 0≤h≤0.3.

The polymer compound having the repeating unit shown by the formula (12) is preferably exemplified by a polymer compound having the repeating unit shown by the formula (15),

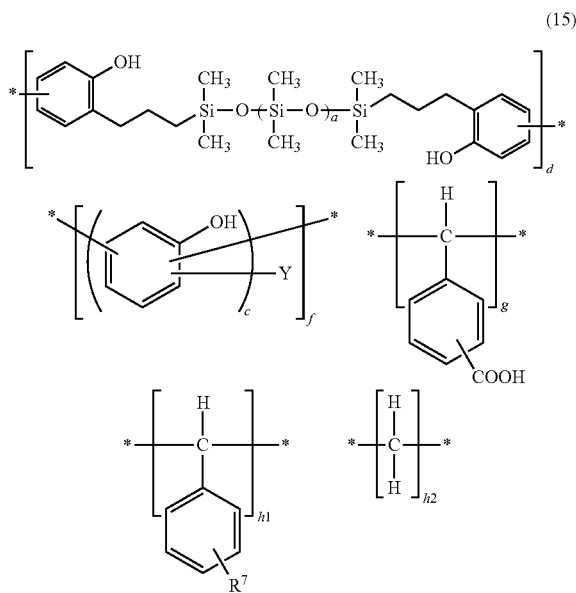

(15)

wherein $R^7$, "a", "c", and Y represent the same meanings as above; "d" and "g" represent a positive number; "f", "h1", and "h2" represent 0 or a positive number; and d+f+g+h1+h2=1.

Particularly preferable examples of the polymer compound having the repeating unit shown by the formula (12) or (15) include a polymer compound having the repeating unit shown by the formula (16),

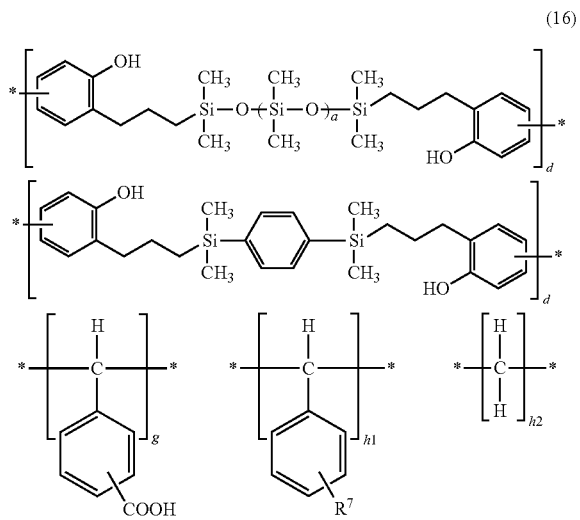

(16)

wherein $R^7$, "a", "d", "f", "g", "h1", and "h2" represent the same meanings as above; and d+f+g+h1+h2=1.

In the formulae (15) and (16), "d", "f", and "g" each has the preferable range as mentioned above; and further, h1+h2=h.

The weight average molecular weight of the polymer compound of the component (A) is preferably in the range of 3,000 to 500,000. Meanwhile, when the weight average molecular weight of the polymer compound becomes lower, viscosity of the polymer compound decreases. Accordingly, both viscosity of the positive photosensitive resin composition containing the polymer compound and viscosity of the photo-curable resin layer of the photo-curable dry film that is formed by using the positive photosensitive resin composition decrease as well.

[Component (B)]

Next, the photosensitive material capable of generating an acid by light and increasing a dissolution rate in an aqueous alkaline solution, which is the component (B) used in the positive photosensitive resin composition of the present invention, is described.

The photosensitive material of the component (B) may be exemplified by a compound having a 1,2-naphthoquinone diazide sulfonyl group.

1,2-naphthoquinone diazide sulfonyl group may be exemplified by the structures shown by the formula (17) or (18).

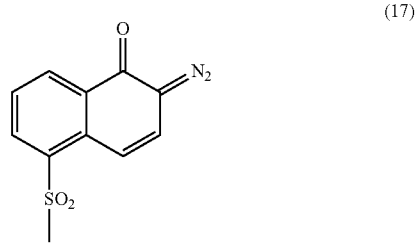

(17)

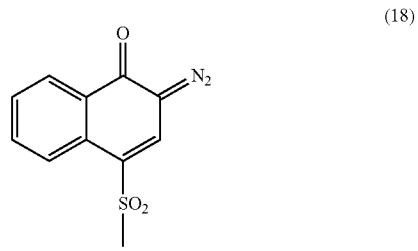

(18)

Preferable examples of a parent compound into which a 1,2-naphthoquinone diazide sulfonyl group is introduced include trihydroxy benzophenone, tetrahydroxy benzophenone, a ballast molecule (low nuclear compound) having a phenolic hydroxyl group as shown by the formula (19), and a novolac resin having a repeating unit shown by the formula (24) and weight average molecular weight in the range of 2,000 to 20,000, preferably 3,000 to 10,000. That is, a compound obtained by substituting a hydrogen atom of a hydroxyl group of the following resin or compound having the phenolic hydroxyl group with a 1,2-naphthoquinone diazide sulfonyl group as mentioned above is preferably used as the photosensitive material of the component (B).

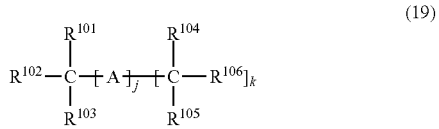

(19)

In the above formula, $R^{101}$ to $R^{106}$ independently represent a hydrogen atom, a methyl group, a group shown by the formula (20), or a group shown by the formula (21). "j" is an integer of 0 to 2 and "k" is an integer of 0 to 2, with the proviso that when k=0, j is 1 or 2. When k is 0 and j is 1, A is a hydrogen atom, a methyl group, or a group shown by the formula (20). When k is 0 and j is 2, one A is a methylene group or a group shown by the formula (22) and the other A is a hydrogen atom, a methyl group, or a group shown by the formula (20). When k is 1, A is a methylene group or a group shown by the formula (22). When k is 2 and j is 1, A is a methine group or a group shown by the formula (23). When k is 2 and j is 2, one A is a methylene group or a group shown by the formula (22) and the other A is a methine group or a group shown by the formula (23).

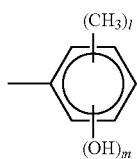
(20)

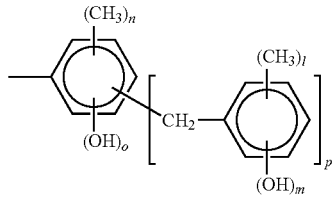
(21)

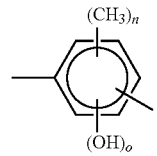
(22)

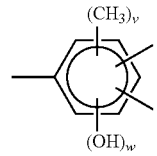
(23)

In the above formula, "l", "m", "n", "o", "p", "v", and "w" each are an integer of 0 to 3, wherein $1+m \leq 5$, $n+o \leq 4$, and $v+w \leq 3$.

In this case, the ballast molecule shown by the formula (19) is preferably designed such that the number of benzene rings is 2 to 20, more preferably 2 to 10, much more preferably 3 to 6, and the ratio of the number of benzene rings to the number of phenolic hydroxyl groups (benzene rings/phenolic hydroxyl groups) is from 0.5 to 2.5, more preferably from 0.7 to 2.0, much more preferably from 0.8 to 1.5.

The above-mentioned ballast molecule may be exemplified by the following.

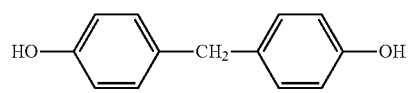
(B-1)

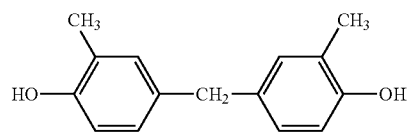
(B-2)

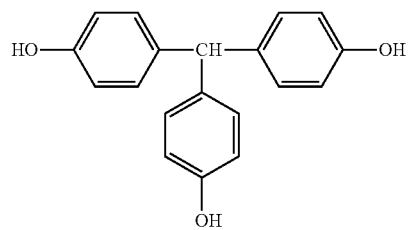
(B-3)

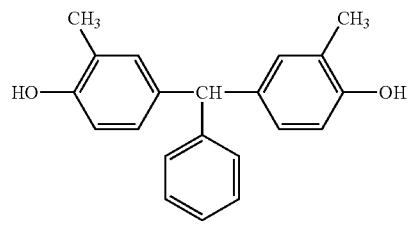
(B-4)

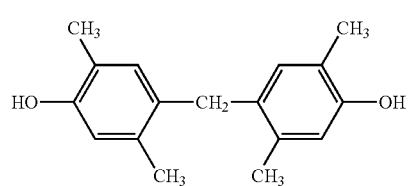
(B-5)

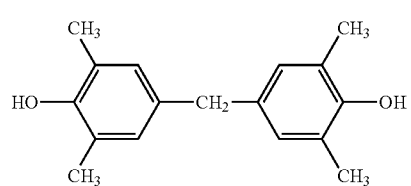
(B-6)

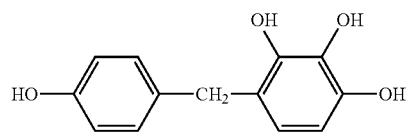
(B-7)

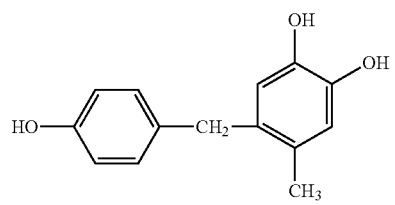
(B-8)

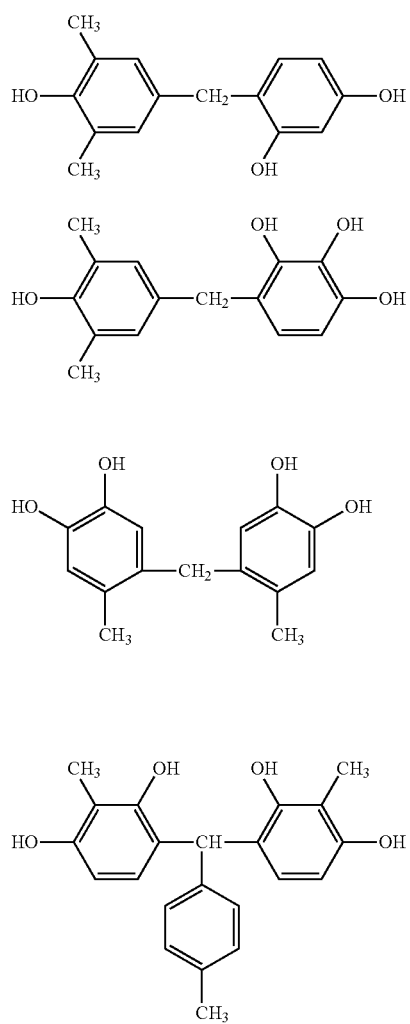
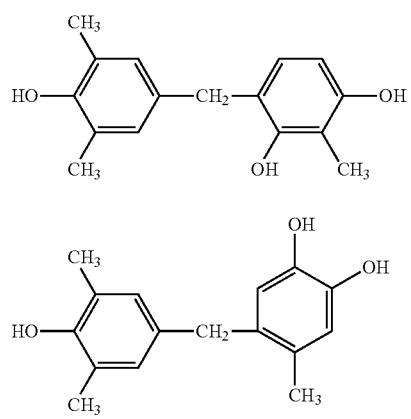
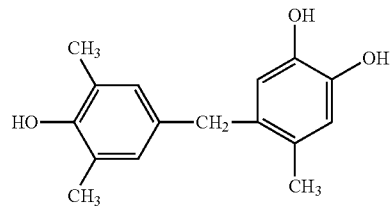
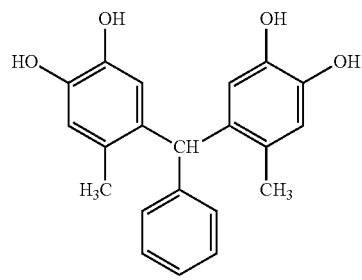
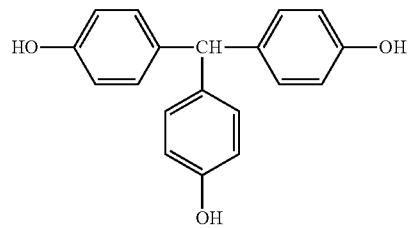
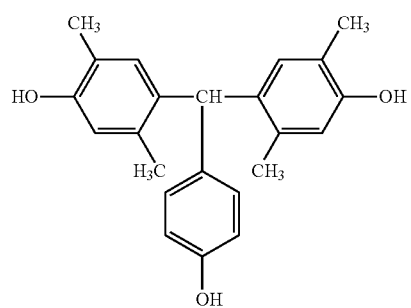
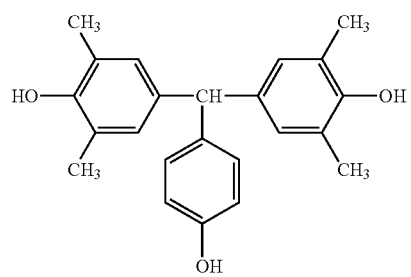

-continued
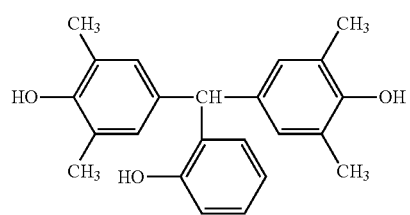 (B-21)
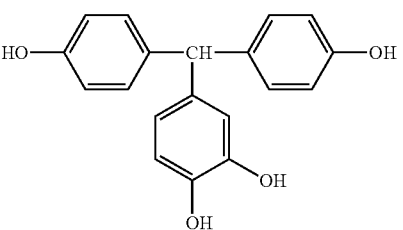 (B-22)
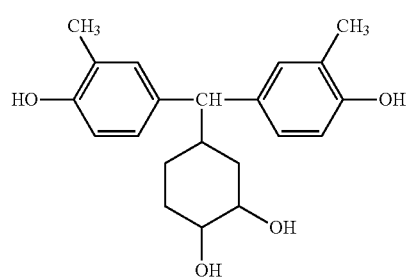 (B-23)
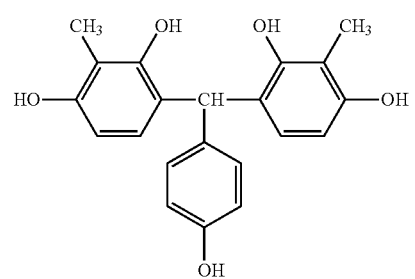 (B-24)
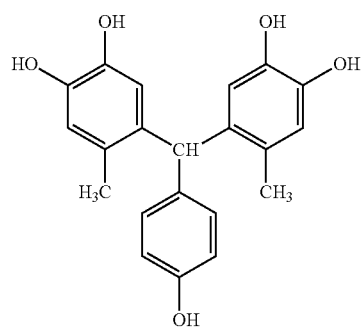 (B-25)
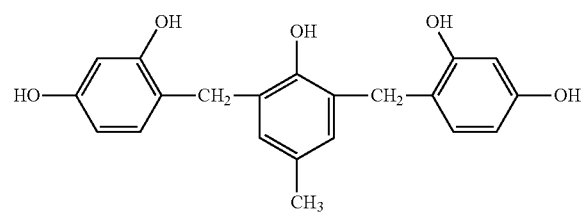 (B-26)
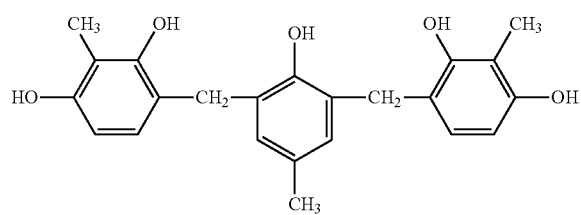 (B-27)
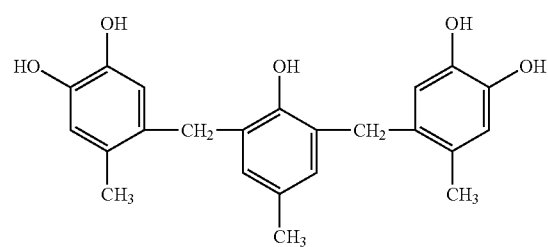 (B-28)
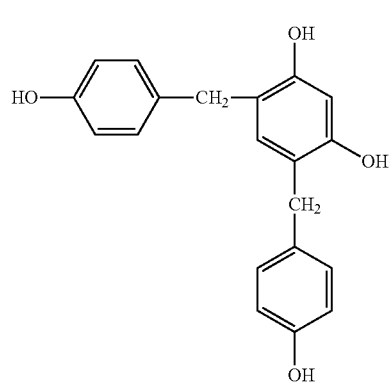 (B-29)
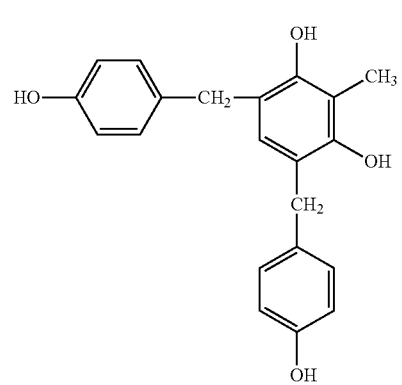 (B-30)

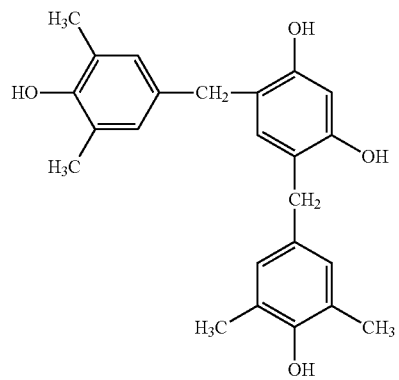
(B-31)
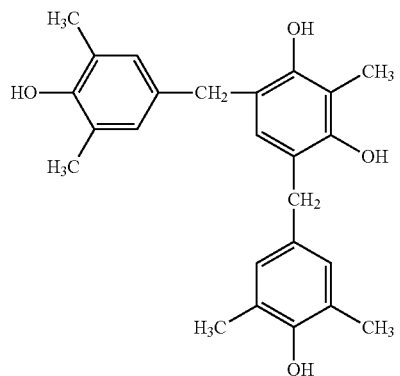
(B-32)
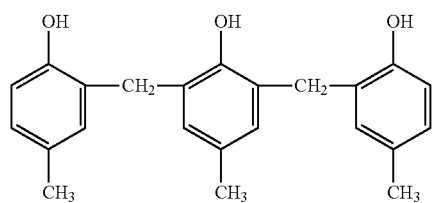
(B-33)
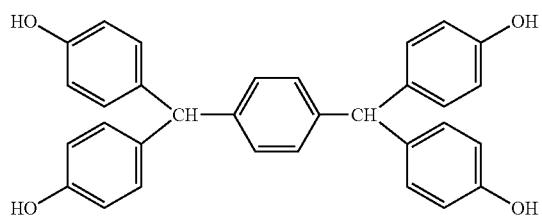
(B-34)
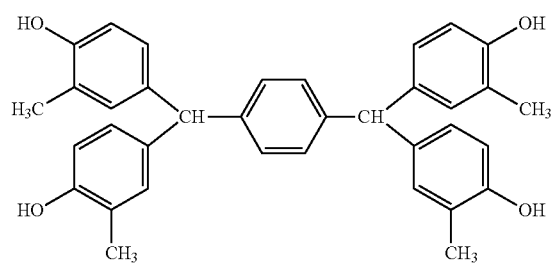
(B-35)
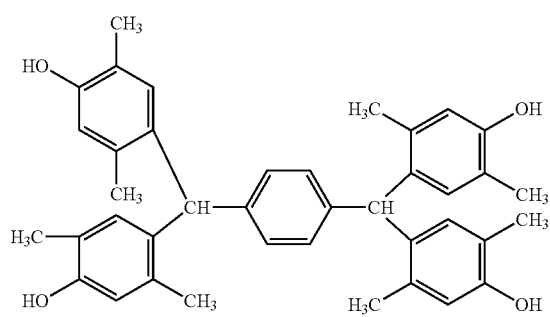
(B-36)
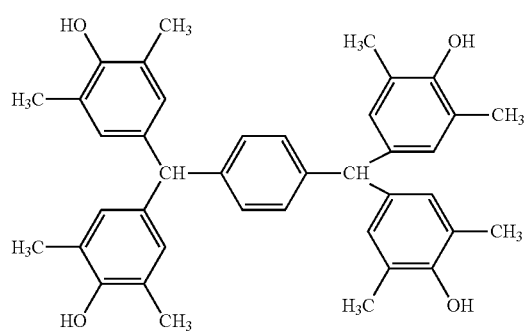
(B-37)
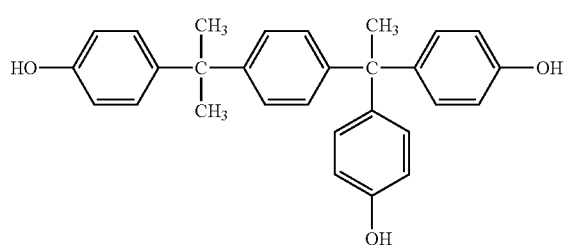
(B-38)
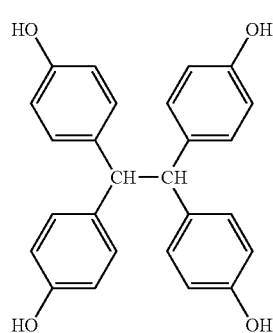
(B-39)
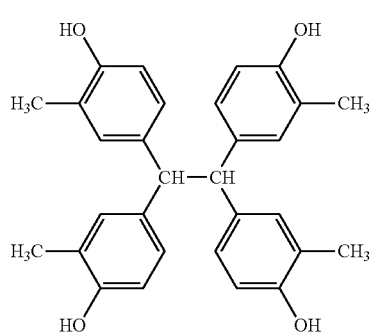
(B-40)

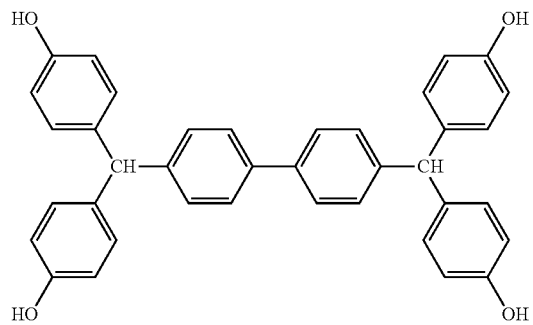 (B-41)

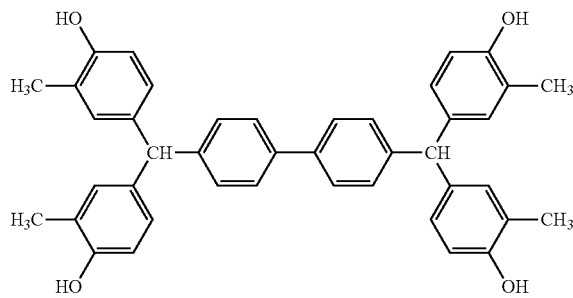 (B-42)

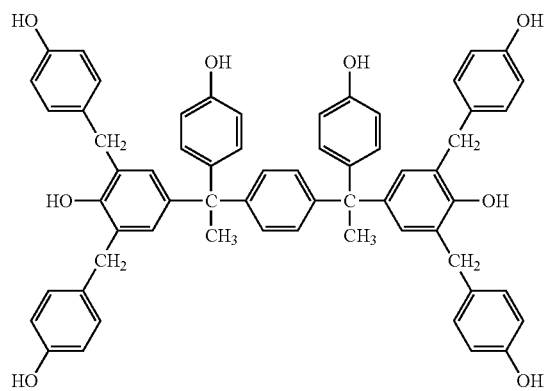 (B-43)

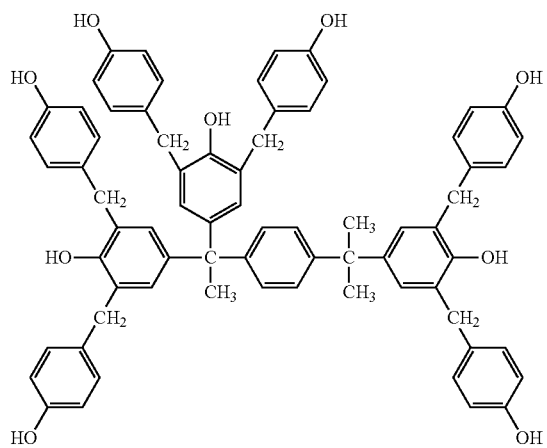 (B-44)

Among the exemplified low nuclear compounds (ballast molecules), (B-3), (B-33), (B-34), (B-38), and (B-29) are preferable, and a compound obtained by substituting a hydrogen atom of a phenolic hydroxyl group of these ballast molecules with a 1,2-naphthoquinone diazide sulfonyl group is preferably used for the photosensitive material of the component (B) in the positive photosensitive resin composition of the present invention.

Other preferable example of the parent compound into which a 1,2-naphthoquinone diazide sulfonyl group is introduced is the novolac resin having a repeating unit shown by the formula (24) and weight average molecular weight in the range of 2,000 to 20,000, preferably 3,000 to 10,000,

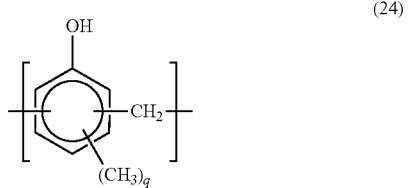 (24)

wherein "q" is an integer of 0 to 3.

The novolac resin having the repeating unit shown by the formula (24) may be synthesized by condensation of phenols shown by the formula (25), specifically at least one phenol compound selected from o-cresol, m-cresol, p-cresol, and 3,5-xylenol, with aldehydes in a standard manner,

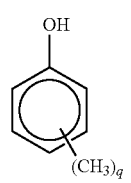 (25)

wherein "q" is an integer of 0 to 3.

Examples of the aldehydes used in this reaction include formaldehyde, paraformaldehyde, acetaldehyde, and benzaldehyde, and formaldehyde is preferable.

The molar ratio of the aldehydes to the phenols shown by the formula (25) (aldehydes/phenols) is preferably from 0.2 to 2, more preferably from 0.3 to 2.

The preferable method for introducing a 1,2-naphthoquinone diazide sulfonyl group into a parent compound is to carry out dehydrochlorination condensation reaction of 1,2-naphthoquinone diazide sulfonyl chloride with phenolic hydroxyl groups in the presence of a base catalyst. In the case that the ballast molecule shown by the formula (19), trihydroxy benzophenone, or tetrahydroxy benzophenone is used, a hydrogen atom of a phenolic hydroxyl group is preferably substituted by a 1,2-naphthoquinone diazide sulfonyl group in a proportion of 10 to 100 mol %, more preferably 50 to 100 mol %. Whereas, in the case that the novolac resin shown by the formula (24) is used, a hydrogen atom of a phenolic hydroxyl group is preferably substituted by 1,2-naphthoquinone diazide sulfonyl group in a proportion of 2 to 50 mol %, more preferably 3 to 27 mol %.

The amount of the photosensitive material of the component (B) to be added is preferably in the range of 1 to 50 parts by mass, more preferably 10 to 40 parts by mass based on 100 parts by bass of the component (A) constituting the base resin. The component (B) may be used solely or as a mixture of two or more kinds.

As mentioned above, when such a component (B) is blended, the solubility in an aqueous alkaline solution before exposure is suppressed due to effect of dissolution inhibition by the component (B), and thus the system becomes alkali insoluble. On the other hand, once exposure is carried out, the component (B) generates an acid and increases the dissolution rate, whereby the system becomes alkali soluble.

That is, when an aqueous alkaline solution is used as a developer, the exposed part dissolves in the developer while the unexposed part does not dissolve therein, whereby a positive pattern can be formed.

[Component (C)]

Next, the crosslinker of the component (C) used in the positive photosensitive resin composition of the present invention is described. The component (C) is one or more crosslinkers selected from an amino condensate modified by formaldehyde or formaldehyde-alcohol, a phenol compound having on average two or more methylol groups or alkoxymethylol groups per molecule, a polyhydric phenol compound in which a hydrogen atom of a phenolic hydroxyl group is substituted by a glycidyl group, a polyhydric phenol compound in which a hydrogen atom of a phenolic hydroxyl group is substituted by a substituent shown by the formula (C-1), and a compound having two or more nitrogen atoms bonded to a glycidyl group per molecule and shown by the formula (C-2),

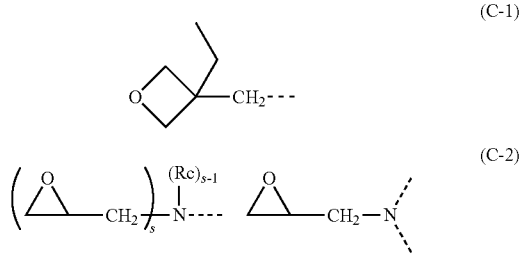

wherein the dotted line represents a bond; $R_c$ represents a linear, branched, or cyclic alkyl group having 1 to 6 carbon atoms; and "s" is 1 or 2.

The amino condensate modified by formaldehyde or formaldehyde-alcohol may be exemplified by melamine condensates modified by formaldehyde or formaldehyde-alcohol and urea condensates modified by formaldehyde or formaldehyde-alcohol.

To prepare a melamine condensate modified by formaldehyde or formaldehyde-alcohol, for example, a melamine monomer is modified with formalin into a methylol form, and optionally, the resultant compound is further modified with an alcohol into an alkoxy form according to a known method, thereby obtaining a modified melamine shown by the formula (26). In this case, lower alcohols such as an alcohol having 1 to 4 carbon atoms are preferred as the alcohol.

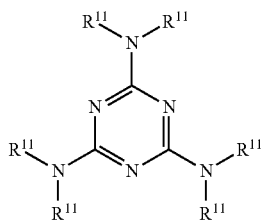

In the above formula, each $R^{11}$ may be the same or different, and represents a methylol group, an alkoxymethyl group containing an alkoxy group having 1 to 4 carbon atoms, or a hydrogen atom, wherein one or more of them is a methylol group or an alkoxymethyl group as mentioned above.

Examples of $R^{11}$ include a hydrogen atom, a methylol group, and alkoxymethyl groups such as a methoxymethyl group and an ethoxymethyl group.

Illustrative examples of the modified melamine shown by the formula (26) include trimethoxymethyl monomethylol melamine, dimethoxymethyl monomethylol melamine, trimethylol melamine, hexamethylol melamine, and hexamethoxymethylol melamine.

Then, the modified melamine shown by the formula (26) or the multimeric compound thereof (e.g. oligomer including dimer and trimer) is polymerized by addition condensation with formaldehyde until a desired molecular weight is achieved according to a known method, thereby obtaining the melamine condensate modified by formaldehyde or formaldehyde-alcohol.

Also, a urea condensate modified with formaldehyde or formaldehyde-alcohol can be prepared by modifying a urea condensate having a desired molecular weight with formaldehyde into a methylol form, and optionally, further modifying the resultant compound with an alcohol into an alkoxy form, according to a known method.

Illustrative examples of the urea condensate modified with formaldehyde or formaldehyde-alcohol include a methoxymethylated urea condensate, an ethoxymethylated urea condensate, and a propoxymethylated urea condensate.

These modified melamine condensates and modified urea condensates may be used solely or as a mixture of two or more kinds.

The phenol compound having on average two or more methylol groups or alkoxymethylol groups per molecule may be exemplified by (2-hydroxy-5-methyl)-1,3-benzenedimethanol, 2,2',6,6'-tetramethoxymethyl bisphenol A, compounds shown by the formulae (C-3) to (C-7), and the like.

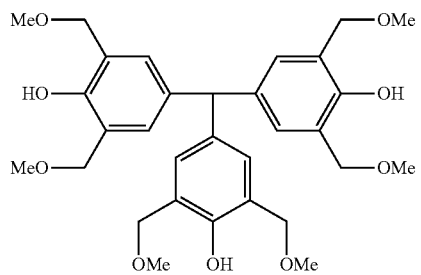

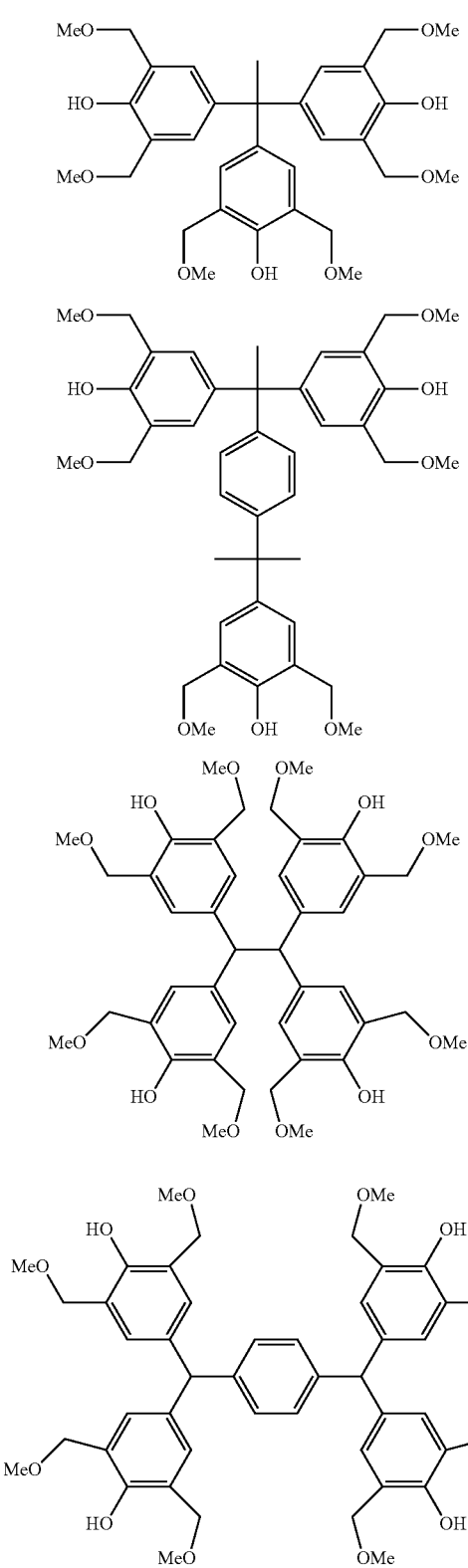

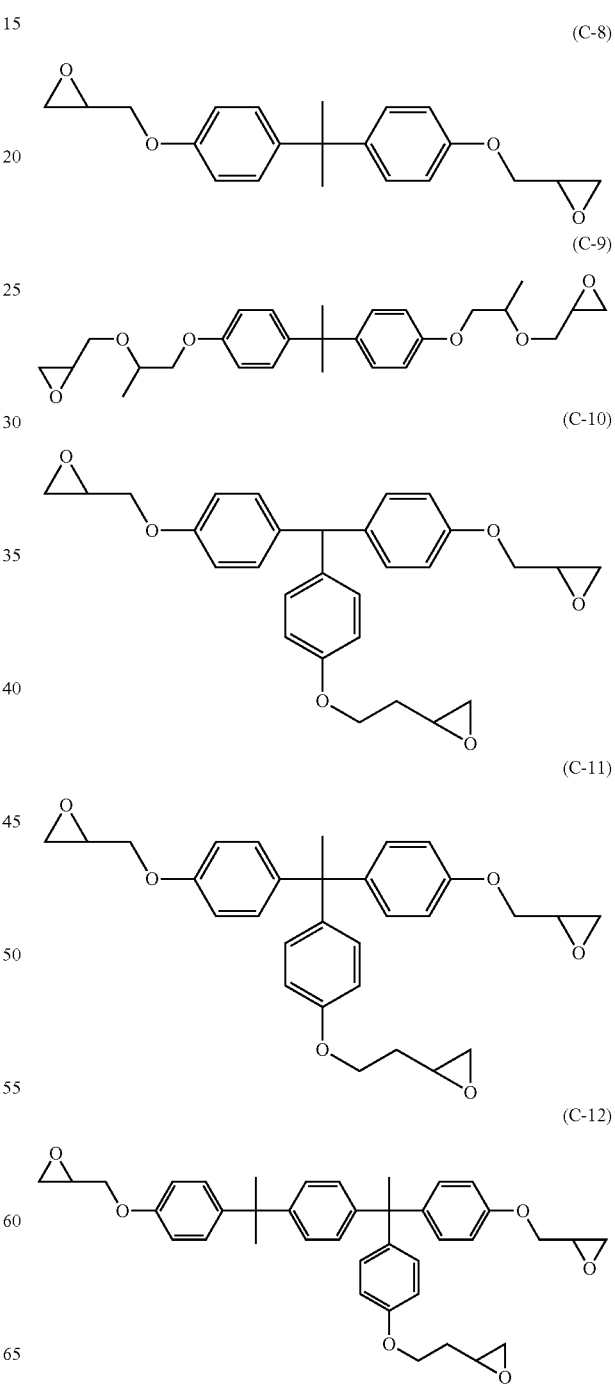

glycidyl group may be exemplified by compounds that are obtained by reacting a hydroxyl group of bisphenol A, tris(4-hydroxyphenyl)methane, or 1,1,1-tris(4-hydroxyphenyl)ethane with epichlorohydrin in the presence of a base catalyst. In addition to this, a compound obtained by substituting a hydrogen atom of a phenolic hydroxyl group of the novolac resin shown by the formula (24), which has been mentioned in the explanation for the photosensitive material of the component (B) with a glycidyl group, is also preferred.

That is, compounds shown by the formulae (C-8) to (C-14) may be mentioned.

These phenol compounds having on average two or more methylol groups or alkoxymethylol groups per molecule may be used solely or as a mixture of two or more kinds.

The polyhydric phenol compound in which a hydrogen atom of a phenolic hydroxyl group is substituted by a

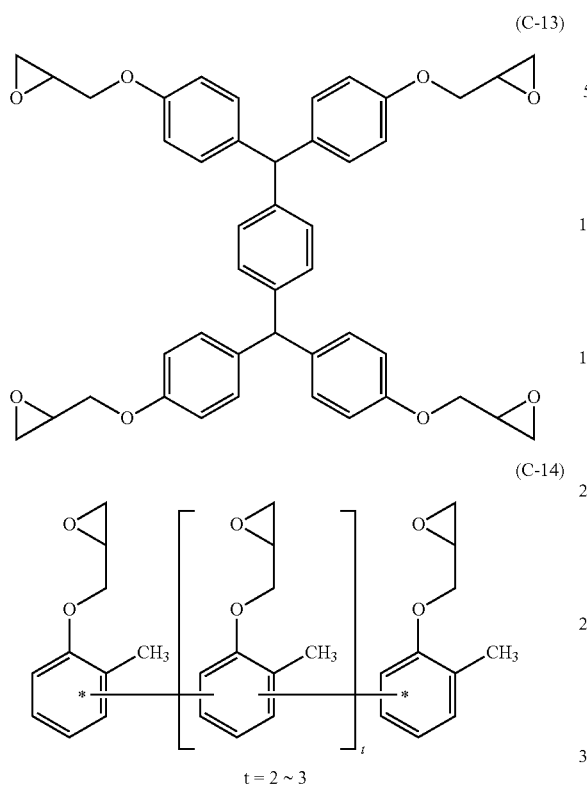
(C-13)

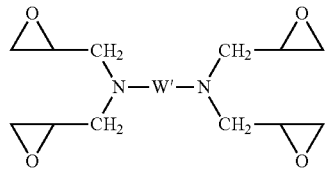
(C-16)

wherein W' represents a linear, branched, or cyclic alkylene group having 2 to 12 carbon atoms, or a divalent aromatic group.

Illustrative examples of the compound shown by the formula (C-16) include compounds shown by the formulae (C-17) to (C-20).

(C-14)

t = 2 ~ 3

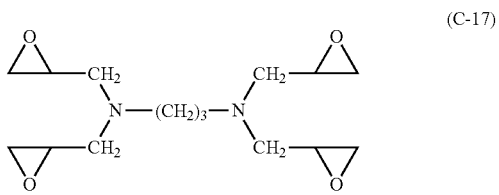
(C-17)

These polyhydric phenol compounds in which a hydrogen atom of a phenolic hydroxyl group is substituted by a glycidyl group may be used solely or as a mixture of two or more kinds.

Also, the polyhydric phenol compound in which a hydrogen atom of a phenolic hydroxyl group is substituted by a substituent shown by the formula (C-1) may be exemplified by a compound shown by the formula (C-15).

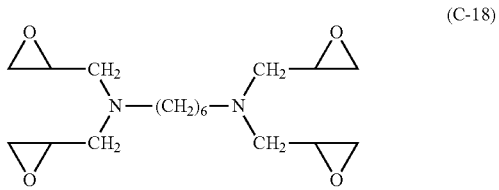
(C-18)

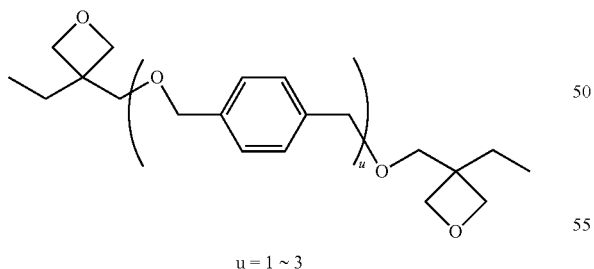
(C-15)

u = 1 ~ 3

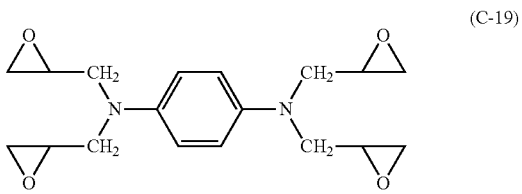
(C-19)

These polyhydric phenol compounds in which a hydrogen atom of a phenolic hydroxyl group is substituted by a substituent shown by the formula (C-1) may be used solely or as a mixture of two or more kinds.

Also, the compound having two or more nitrogen atoms bonded to a glycidyl group per molecule and shown by the formula (C-2) may be exemplified by a compound shown by the formula (C-16),

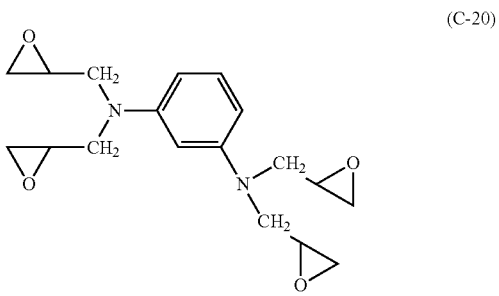
(C-20)

Also, other examples of the compound having two or more nitrogen atoms bonded to a glycidyl group per molecule and shown by the formula (C-2) include a compound shown by the formula (C-21).

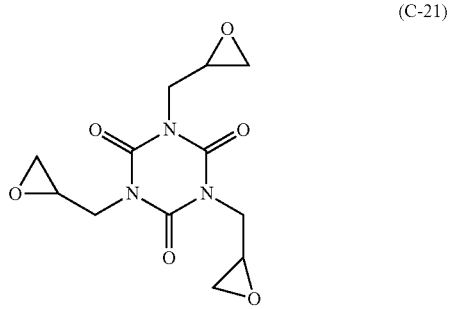 [SMILES: O=c1n(CC2CO2)c(=O)n(CC2CO2)c(=O)n1CC1CO1]

(C-21)

These compound having two or more nitrogen atoms bonded to a glycidyl group per molecule and shown by the formula (C-2) may be used solely or as a mixture of two or more kinds.

The crosslinker of the component (C) serves to initiate the curing reaction with the above-mentioned polymer compound of the component (A), facilitates to form a pattern, and enhances strength of the cured product. The weight average molecular weight of the crosslinker is preferably in the range of 150 to 10,000, particularly preferably 200 to 3,000, in view of photo-curability and heat resistance.

In view of reliability as the top coat to protect electric and electronic parts after photo-cure and post-cure, the amount of the crosslinker of the component (C) to be blended is preferably in the range of 0.5 to 50 parts by mass, more preferably 1 to 30 parts by mass based on 100 parts by mass of the component (A) constituting the base resin.

[Component (D)]

As to (D) the solvent, those capable of dissolving the polymer compound of the component (A), the photosensitive material of the component (B), and the crosslinker of the component (C) therein can be used.

Illustrative examples of the solvent include ketones such as cyclohexanone, cyclopentanone, and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone; and these may be used solely or as a mixture of two or more kinds. Among them, ethyl lactate, cyclohexanone, cyclopentanone, propylene glycol monomethyl ether acetate, and γ-butyrolactone, or a mixture of them are particularly preferable, because these materials have the utmost solubility to the photosensitive material of the component (B).

In view of compatibility, viscosity, and coating properties of the positive photosensitive resin composition, the amount of the solvent to be blended is preferably in the range of 50 to 2,000 parts by mass, more preferably 100 to 1,000 parts by mass based on 100 parts by mass of the total amount of (A) the polymer compound, (B) the photosensitive material, and (C) the crosslinker.

[Other Additives]

In addition to the components (A) to (D) as mentioned above, other additives may be added to the positive photosensitive resin composition of the present invention. The additives may be exemplified by a surfactant which is commonly used to enhance coating properties, and so forth.

As the surfactant, nonionic type surfactants such as fluorinated surfactants are preferable, and illustrative examples thereof include perfluoroalkyl polyoxyethylene ethanol, fluorinated alkyl ester, perfluoroalkylamine oxide, and a fluorine-containing organosiloxane compound.

These surfactants may be commercially available products, and illustrative examples thereof include Flolade "FC-4430" (available from Sumitomo 3M Ltd.), Surflon "S-141" and "S-145" (both are available from Asahi Glass Co., Ltd.), Unidyne "DS-401", "DS-4031", and "DS-451" (all are available from Daikin Industries, Ltd.), Megafac "F-8151" (available from DIC Co.), and "X-70-093" (available from Shin-Etsu Chemical Co., Ltd.). Among them, Flolade "FC-4430" (available from Sumitomo 3M Ltd.) and "X-70-093" (available from Shin-Etsu Chemical Co., Ltd.) are preferable.

The positive photosensitive resin composition of the present invention may be prepared by a usual method. After above-mentioned respective components are mixed by stirring, the resulting mixture is filtrated by a filter or the like to prepare the positive photosensitive resin composition. Also, in the case of manufacturing a photo-curable dry film, which will be mentioned later, the composition to be used may be prepared similarly by using respective components of this composition.

<Patterning Process>

The patterning using the positive photosensitive resin composition of the present invention thus prepared may be performed by a well-known lithography technology.

For example, the positive photosensitive resin composition is applied by a spin coating method onto a silicon wafer, a $SiO_2$ substrate, a SiN substrate, or a substrate formed with a pattern of a copper wiring or the like, and then, it is prebaked at a temperature ranging from 80 to 130° C. for a time ranging from 50 to 600 seconds approximately to form a photosensitive resin film having a thickness of 1 to 50 μm, preferably 1 to 30 μm, more preferably 5 to 20 μm.

In the spin coating method, after about 5 mL of the positive photosensitive resin composition is dispensed on a silicon substrate, the substrate is rotated, whereby the positive photosensitive resin composition may be applied onto the substrate. By adjusting the rotation speed during this operation, film thickness of the photosensitive resin film on the substrate can be readily controlled.

Next, a mask to form an intended pattern is put over the photosensitive resin film, and then, a high energy beam having a wavelength of 190 to 500 nm such as an i-beam and a g-beam is irradiated thereto with an exposure dose of about 1 to 5,000 mJ/cm$^2$, preferably about 100 to 2,000 mJ/cm$^2$. By this exposure, the photosensitive material of the component (B) in the positive photosensitive resin composition generates an acid in the exposed part, whereby the exposed part becomes soluble in an aqueous alkaline solution developer.

Then, if necessary, post-exposure bake (PEB) may be carried out on a hot plate at a temperature ranging from 60 to 150° C. for a time ranging from 1 to 10 minutes, preferably at a temperature ranging from 80 to 120° C. for a time ranging from 1 to 5 minutes.

Thereafter, development is carried out by using a developer. The preferable alkaline developer for the positive photosensitive resin composition of the present invention is a 2.38% TMAH aqueous solution. The development can be carried out by a usual method, for example, by soaking the substrate formed with a pattern into a developer. Then, if necessary, washing, rinsing, drying, and so forth may be performed to obtain a film having an intended pattern. Meanwhile, in the case that patterning is not necessary, for example, in the case that a uniform film is merely wanted, the same procedure as the above-mentioned patterning process except using no photomask may be employed.

The obtained pattern is preferably post-cured by using an oven or a hot plate at a temperature ranging from 100 to 250° C., preferably from 150 to 220° C., more preferably from 170 to 190° C. If the post-cure temperature is from 100 to 250° C., the crosslinking density of the photosensitive resin film may be increased, and a remaining volatile component may be removed. Thus, this temperature range is preferable in view of adhesiveness to a substrate, heat resistance, strength, and electronic characteristics. The time for the post-cure can be from 10 minutes to 10 hours.

The cured film thus obtained has excellent flexibility, adhesiveness to a substrate, heat resistance, electric characteristics, mechanical strength, and chemical resistance to a soldering flux liquid, and thus, a semiconductor device having the cured film like this as a top coat has superior reliability, and especially, generation of a crack during a thermal cycle test can be prevented. In other words, the positive photosensitive resin composition of the present invention can provide a top coat suitable to protect electric and electronic parts, a semiconductor device, and the like.

<Photo-Curable Dry Film>

Also, the present invention provides a photo-curable dry film produced by using the above-mentioned positive photosensitive resin composition.

At first, the structure of the photo-curable dry film of the present invention will be described. The photo-curable dry film has a structure that a photo-curable resin layer is sandwiched between a supporting film and a top coat film. For the photo-curable resin layer, the positive photosensitive resin composition of the present invention, which is effective to form a top coat to protect electric and electronic parts, may be used. Such a photo-curable dry film can form a fine pattern in wide ranges of film thickness and wavelength, and can be post-cured at low temperature to give a top coat having excellent flexibility, heat resistance, electric characteristics, adhesiveness, reliability, and chemical resistance.

In the present invention, the photo-curable resin layer of the photo-curable dry film that is obtained from the above-mentioned positive photosensitive resin composition by drying to evaporate a solvent is a solid, so that the photo-curable resin layer does not contain a solvent. Therefore, there is no fear that bubbles due to the evaporation remain inside the photo-curable resin layer as well as between the photo-curable resin layer and the substrate having concavity and convexity.

The interlayer insulating film is tending to become thinner as a semiconductor device progresses toward downsizing, thinning, and increasing layers; and in view of planarity and step coverage of the substrate having concavity and convexity, film thickness of the photo-curable resin layer is preferably in the range of 10 to 100 µm, more preferably 10 to 70 µm, particularly preferably 10 to 50 µm.

Also, in the photo-curable resin layer, viscosity and fluidity are closely interrelated. Thus, the photo-curable resin layer can express appropriate fluidity in the appropriate range of viscosity, and it can penetrate deep into a narrow space. Accordingly, when the photo-curable dry film having the photo-curable resin layer formed of the positive photosensitive resin composition of the present invention with an appropriate viscosity as mentioned above is adhered to a substrate having concavity and convexity, the photo-curable resin layer can cover the substrate in accordance with the concavity and the convexity, thereby achieving a high flatness. Moreover, the polymer compound of the component (A), which is a main component of the photo-curable resin layer, contains a siloxane chain; and because of this, the surface tension thereof is so low that a higher flatness may be achievable. In addition, if the photo-curable resin layer is adhered to the substrate under a vacuum environment, generation of a void therebetween can be more effectively prevented.

Next, the method for producing the photo-curable dry film of the present invention will be described.

In the photo-curable dry film of the present invention, the positive photosensitive resin composition used for forming the photo-curable resin layer is obtained by mixing the components with stirring, followed by filtration through a filter or the like, as mentioned above. This positive photosensitive resin composition can be used as the material for forming the photo-curable resin layer.

The supporting film used in the photo-curable dry film of the present invention may be a monolayer or a multilayer film having plural polymer films laminated. The material thereof may be exemplified by a synthetic resin film and so forth including polyethylene, polypropylene, polycarbonate, and polyethylene terephthalate. Among these, polyethylene terephthalate is preferable because it has appropriate flexibility, mechanical strength, and heat resistance. These films may be variously treated, for example, with the corona treatment and with coating treatment by a releasing agent. For this, many commercial films may be used. Illustrative examples thereof include Cerapeel WZ (RX) and Cerapeel BX8® (both are available from Toray Advanced Film Co., Ltd.), E7302 and E7304 (both are available from Toyobo Co., Ltd.), Purex G31 and Purex G71T1 (both are available from Teijin DuPont Films Japan Ltd.), and PET38×1-A3, PET38×1-V8, and PET38×1-X08 (all available from Nippa Co., Ltd.).

The top coat film used in the photo-curable dry film of the present invention may be the same film as the above-mentioned supporting film, but polyethylene terephthalate and polyethylene having appropriate flexibility are preferable. For this, commercial films may be used, and illustrative examples thereof include, besides the polyethylene terephthalates that have already been mentioned, polyethylene such as GF-8 (available from Tamapoly Co., Ltd.) and PE Film 0-Type (available from Nippa Co., Ltd.).

The thicknesses of the supporting film and the top coat film are preferably both in the range of 10 to 100 µm, particularly preferably 25 to 50 µm, in view of stable production of the photo-curable dry film and the rolling habit around a roll axis, so-called curl-prevention.

As to the manufacturing equipment of the photo-curable dry film, a film coater that is generally used for producing an adhesive product may be used. Illustrative examples of the film coater include a comma coater, a comma reverse coater, a multi coater, a die coater, a lip coater, a lip reverse coater, a direct gravure coater, an offset gravure coater, a 3-roll bottom revere coater, and a 4-roll bottom reverse coater.

The supporting film is rolled-out from a roll-out axis of the film coater; and the positive photosensitive resin composition is applied onto the supporting film with a prescribed thickness to continuously form the photo-curable resin layer while it is passing through a coater head of the film coater; and then, after it is passed through a hot-air circulating oven at a prescribed temperature for a prescribed period, the photo-curable resin layer that has been continuously dried on the supporting film is passed through a laminate roll together with the top coat film that has been rolled-out from a different roll-out axis of the film coater under a prescribed pressure, thereby bonding the top coat film to the photo-curable resin layer on the supporting film, which is then followed by roll-up to a roll-up axis of the film coater. In this case, temperature of the hot-air circulating oven is preferably in the range of 25 to 150° C., the time for passing through is preferably in the range of 1 to 100 minutes, and the laminate roll pressure is preferably in the range of 0.01 to 5 MPa.

Next, the patterning process using the photo-curable dry film that is obtained in the way as mentioned above will be described.

In the patterning process using the photo-curable dry film of the present invention, first, the top coat film is delaminated from the photo-curable dry film, and thereby the photo-curable resin layer is adhered to the substrate. Then, photo exposure is performed, followed by post-exposure bake. Subsequently, development is performed, and if necessary post-curing is carried out, whereby a cured film formed with a pattern can be obtained.

First, the photo-curable dry film is adhered to a substrate by using a film adhering equipment. The substrate may be exemplified by a silicon wafer, a silicon wafer for TSV, a circuit substrate made of plastics, ceramics, various metals, and the like, and especially, the substrate having a trench or a hole with an aperture width of 10 to 100 μm and a depth of 10 to 120 μm may be mentioned. As to the film adhering equipment, a vacuum laminator is preferable.

The photo-curable dry film is attached to a film adhering equipment, and the photo-curable resin layer that becomes exposed by delaminating the top coat film of the photo-curable dry film is adhered to a substrate on a table with a prescribed temperature by using an adhering roll under a prescribed pressure in a vacuum chamber with a prescribed degree of vacuum. Meanwhile, temperature of the table is preferably in the range of 60 to 120° C., pressure of the adhering roll is preferably in the range of 0 to 5.0 MPa, and degree of vacuum in the vacuum chamber is preferably in the range of 50 to 500 Pa.

After adhesion, patterning may be performed by using a well-known lithography technology. At this time, in order to effectively carry out the photo-curing reaction of the photo-curable resin layer as well as to enhance the adhesiveness between the photo-curable resin layer and the substrate, a pre-bake may be carried out if necessary. The pre-bake may be carried out, for example, at a temperature ranging from 40 to 140° C. for a time ranging from 1 minute to 1 hour approximately.

Then, curing is carried out by exposure to a light having a wavelength of 190 to 500 nm via a photomask under the state of intervention of the supporting film or under the state of the supporting film delaminated. The photomask may be obtained by engraving a prescribed pattern. Meanwhile, the photomask is preferably made of a material that can shield the light having a wavelength of 190 to 500 nm. For example, chromium and the like are preferably used, but it is not limited thereto.

As to the light having a wavelength of 190 to 500 nm, lights having various wavelengths generated from, for example, a radiation-beam generating instrument may be used, and illustrative examples thereof include UV lights such as a g-beam and an i-beam, and far ultraviolet lights (248 nm and 193 nm). The wavelength is preferably in the range of 248 to 436 nm. The exposure dose is preferably, for example, in the range of 10 to 3,000 mJ/cm$^2$. By subjecting to the exposure as mentioned above, the photosensitive material of the component (B) in the positive photosensitive resin composition used in the photo-curable resin layer generates an acid in the exposed part, whereby the exposed part becomes soluble in aqueous alkaline solution developer.

Then, post-exposure baking (PEB) may be carried out to enhance the development sensitivity. The post-exposure baking may be performed, for example, at a temperature ranging from 40 to 140° C. for the time ranging from 0.5 to 10 minutes.

Thereafter, development is carried out by using a developer. A preferable aqueous alkaline solution developer for the positive photosensitive resin composition of the present invention is a 2.38% TMAH aqueous solution. The development may be carried out by a usual method, for example, by soaking the substrate formed with a pattern into a developer. Then, if necessary, washing, rinsing, drying, and so forth may be performed to obtain a film of the photo-curable resin layer having an intended pattern. Meanwhile, in the case that patterning is not necessary, for example, in the case that a uniform film is merely wanted, the same procedure as the above-mentioned patterning process except using no photomask may be employed.

The obtained pattern is preferably post-cured by using an oven or a hot plate at a temperature ranging from 100 to 250° C., preferably from 150 to 220° C., more preferably from 170 to 190° C. If the post-cure temperature is from 100 to 250° C., the crosslinking density of the photosensitive resin layer film may be increased, and a remaining volatile component may be removed. Thus, this temperature range is preferable in view of adhesiveness to a substrate, heat resistance, strength, and electronic characteristics. The time for the post-cure may be from 10 minutes to 10 hours.

The cured film thus obtained has excellent flexibility, adhesiveness to a substrate, heat resistance, electric characteristics, mechanical strength, and chemical resistance to a soldering flux liquid; and thus, a semiconductor device having the cured film like this as a top coat has superior reliability, and especially, generation of a crack during a thermal cycle test can be prevented. In other words, the photo-curable dry film of the present invention can provide a top coat suitable to protect electric and electronic parts, a semiconductor device, and the like.

In this way, the photo-curable dry film of the present invention can be effectively applied to the substrate having a trench or a hole. Thus, the present invention provides a layered product which has a substrate including a trench and/or a hole each having an aperture width in the range of 10 to 100 μm and a depth in the range of 10 to 120 μm, and a cured layer of the photo-curable resin formed of the photo-curable dry film laminated on the substrate.

As mentioned above, the positive photosensitive resin composition of the present invention and the photo-curable dry film produced by using this composition can become a top coat having excellent flexibility, adhesiveness, heat resistance, electric characteristics, mechanical strength, and chemical resistance by curing themselves. Thus, these are useful to an insulating film for a semiconductor device including a rewiring use, an insulating film for a multilayer printed substrate, a solder mask, a cover lay film, and an insulating film for embedding a through-silicon via (TSV) as well as useful for bonding to a substrate.

EXAMPLES

Hereinafter, the present invention is explained in more detail by referring to Synthesis Examples and Examples, but the present invention is not limited to the following examples. Meanwhile, in the following examples, the term "parts" denotes parts by mass.

[Synthesis of Polymer Compound]

In the following Synthesis Examples 1 to 10, Polymer compounds (A-1) to (A-10) of the present invention were synthesized. The structures of Compounds 1 to 7 used in Synthesis Examples 1 to 10 are shown below.

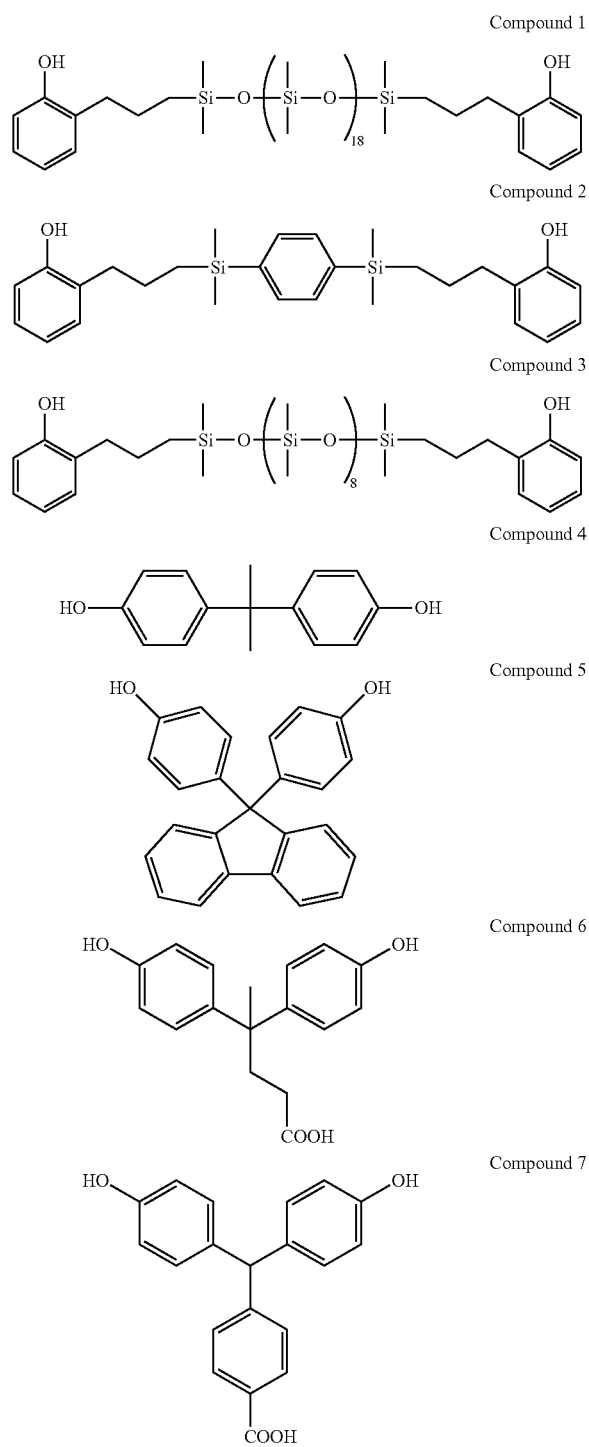

Synthesis Example 1

Into a three-necked 300 mL flask inside which was replaced with nitrogen were placed 50 g (28.8 mmol) of Compound 1, 13.3 g (28.8 mmol) of Compound 2, 8.6 g (57.6 mmol) of terephthalaldehydic acid, 50 g of dichloroethane, and 13 g of toluene, and the flask was then heated to 75° C. Thereafter, 3.6 g (31.2 mmol) of methanesulfonic acid was added dropwise thereinto, and the resulting mixture was further heated to 80° C., and aged for 17 hours. After cooled to room temperature, 150 g of 4-methyl-2-pentanone was added to the mixture. This mixture was transferred to a 1 L separatory funnel, and washed with 150 g of ultrapure water four times. The organic layer was then distilled off under reduced pressure, and 150 g of cyclopentanone was added to obtain Polymer compound (A-1) in the solvent mainly consisting of cyclopentanone with the solid concentration of 50 to 60% by mass.

The molecular weight of this polymer compound was measured by GPC, and consequently the weight average molecular weight was 5,000 in terms of polystyrene. Further, it was confirmed by $^1$HNMR spectroscopic analysis that each component was introduced into the polymer. Also, it was found that in the formula (12), d=0.25, e=0, f=0.25, g=0.5, and h=0.

Synthesis Example 2

Into a three-necked 300 mL flask inside which was replaced with nitrogen were placed 50 g (28.8 mmol) of Compound 1, 13.3 g (28.8 mmol) of Compound 2, 8.6 g (57.6 mmol) of terephthalaldehydic acid, 50 g of dichloroethane, and 13 g of toluene, and the flask was then heated to 75° C. Thereafter, 3.6 g (31.2 mmol) of methanesulfonic acid was added dropwise thereinto, and the resulting mixture was further heated to 80° C., and aged for 17 hours. After cooled to 75° C. again, 0.46 g (5.8 mmol) of a 37% formaldehyde aqueous solution was added thereto, and this mixture solution was aged for 3 hours. After cooled to room temperature, 150 g of 4-methyl-2-pentanone was added to the mixture. This mixture was transferred to a 1 L separatory funnel, and washed with 150 g of ultrapure water four times. The organic layer was then distilled off under reduced pressure, and 150 g of cyclopentanone was added to obtain Polymer compound (A-2) in the solvent mainly consisting of cyclopentanone with the solid concentration of 50 to 60% by mass.

The molecular weight of this polymer compound was measured by GPC, and consequently the weight average molecular weight was 13,500 in terms of polystyrene. Further, it was confirmed by $^1$HNMR spectroscopic analysis that each component was introduced into the polymer. Also, it was found that in the formula (12), d=0.24, e=0, f=0.24, g=0.47, and h=0.05.

Synthesis Example 3

The same synthesis procedure was performed as in Synthesis Example 2 except that the amount of the 37% formaldehyde aqueous solution was changed to 0.82 g (10.0 mmol), to obtain Polymer compound (A-3).

The molecular weight of this polymer compound was measured by GPC, and consequently the weight average molecular weight was 42,200 in terms of polystyrene. Further, it was confirmed by $^1$HNMR spectroscopic analysis that each component was introduced into the polymer. Also, it was found that in the formula (12), d=0.23, e=0, f=0.23, g=0.46, and h=0.08.

Synthesis Example 4

The same synthesis procedure was performed as in Synthesis Example 3 except that 28.7 g (28.8 mmol) of Compound 3 was used in place of Compound 1, to obtain Polymer compound (A-4).

The molecular weight of this polymer compound was measured by GPC, and consequently the weight average molecular weight was 21,000 in terms of polystyrene. Further, it was confirmed by $^1$HNMR spectroscopic analysis that each component was introduced into the polymer. Also, it was found that in the formula (12), d=0.23, e=0, f=0.23, g=0.46, and h=0.08.

Synthesis Example 5

Into a three-necked 300 mL flask inside which was replaced with nitrogen were placed 50 g (28.8 mmol) of Compound 1, 13.3 g (28.8 mmol) of Compound 2, 6.8 g (45.2 mmol) of terephthalaldehydic acid, 1.3 g of (12.3 mmol) of benzaldehyde, 50 g of dichloroethane, and 13 g of toluene, and the flask was then heated to 75° C. Thereafter, 3.6 g (31.2 mmol) of methanesulfonic acid was added dropwise thereinto, and the resulting mixture was further heated to 80° C., and aged for 17 hours. After cooled to 75° C. again, 0.82 g (10.0 mmol) of a 37% formaldehyde aqueous solution was added thereto, and this mixture solution was aged for 3 hours. After cooled to room temperature, 150 g of 4-methyl-2-pentanone was added to the mixture. This mixture was transferred to a 1 L separatory funnel, and washed with 150 g of ultrapure water four times. The organic layer was then distilled off under reduced pressure, and 150 g of cyclopentanone was added to obtain Polymer compound (A-5) in the solvent mainly consisting of cyclopentanone with the solid concentration of 50 to 60% by mass.

The molecular weight of this polymer compound was measured by GPC, and consequently the weight average molecular weight was 20,200 in terms of polystyrene. Further, it was confirmed by $^1$HNMR spectroscopic analysis that each component was introduced into the polymer. Also, it was found that in the formula (15), d=0.23, f=0.23, g=0.36, h1=0.10, and h2=0.08.

Synthesis Example 6

Into a three-necked 300 mL flask inside which was replaced with nitrogen were placed 50 g (28.8 mmol) of Compound 1, 6.6 g (28.8 mmol) of Compound 4, 8.6 g (57.6 mmol) of terephthalaldehydic acid, 50 g of dichloroethane, and 13 g of toluene, and the flask was then heated to 75° C. Thereafter, 3.6 g (31.2 mmol) of methanesulfonic acid was added dropwise thereinto, and the resulting mixture was further heated to 80° C., and aged for 17 hours. After cooled to 75° C. again, 0.82 g (10.0 mmol) of a 37% formaldehyde aqueous solution was added thereto, and this mixture solution was aged for 3 hours. After cooled to room temperature, 150 g of 4-methyl-2-pentanone was added to the mixture. This mixture was transferred to a 1 L separatory funnel, and washed with 150 g of ultrapure water four times. The organic layer was then distilled off under reduced pressure, and 150 g of cyclopentanone was added to obtain Polymer compound (A-6) in the solvent mainly consisting of cyclopentanone with the solid concentration of 50 to 60% by mass.

The molecular weight of this polymer compound was measured by GPC, and consequently the weight average molecular weight was 35,000 in terms of polystyrene. Further, it was confirmed by $^1$HNMR spectroscopic analysis that each component was introduced into the polymer. Also, it was found that in the formula (12), d=0.23, e=0, f=0.23, g=0.46, and h=0.08.

Synthesis Example 7

The same synthesis procedure was performed as in Synthesis Example 6 except that 10.1 g (28.8 mmol) of Compound 5 was used in place of Compound 4, to obtain Polymer compound (A-7).

The molecular weight of this polymer compound was measured by GPC, and consequently the weight average molecular weight was 40,000 in terms of polystyrene. Further, it was confirmed by $^1$HNMR spectroscopic analysis that each component was introduced into the polymer. Also, it was found that in the formula (12), d=0.23, e=0, f=0.23, g=0.46, and h=0.08.

Synthesis Example 8

Into a three-necked 300 mL flask inside which was replaced with nitrogen were placed 80 g (46.0 mmol) of Compound 1, 3.3 g (11.5 mmol) of Compound 6, 8.6 g (57.6 mmol) of terephthalaldehydic acid, 50 g of dichloroethane, and 13 g of toluene, and the flask was then heated to 75° C. Thereafter, 4.6 g (47.9 mmol) of methanesulfonic acid was added dropwise thereinto, and the resulting mixture was further heated to 80° C., and aged for 17 hours. After cooled to 75° C. again, 0.75 g (9.2 mmol) of a 37% formaldehyde aqueous solution was added thereto, and this mixture solution was aged for 3 hours. After cooled to room temperature, 150 g of 4-methyl-2-pentanone was added to the mixture. This mixture was transferred to a 1 L separatory funnel, and washed with 150 g of ultrapure water four times. The organic layer was then distilled off under reduced pressure, and 150 g of cyclopentanone was added to obtain Polymer compound (A-B) in the solvent mainly consisting of cyclopentanone with the solid concentration of 50 to 60% by mass.

The molecular weight of this polymer compound was measured by GPC, and consequently the weight average molecular weight was 36,000 in terms of polystyrene. Further, it was confirmed by $^1$HNMR spectroscopic analysis that each component was introduced into the polymer. Also, it was found that in the formula (12), d=0.37, e=0.09, f=0, g=0.46, and h=0.08.

Synthesis Example 9

The same synthesis procedure was performed as in Synthesis Example 8 except that 1.7 g (28.8 mmol) of 4-hydroxyphenylacetic acid was used in place of Compound 6, to obtain Polymer compound (A-9).

The molecular weight of this polymer compound was measured by GPC, and consequently the weight average molecular weight was 35,000 in terms of polystyrene. Further, it was confirmed by $^1$HNMR spectroscopic analysis that each component was introduced into the polymer. Also, it was found that in the formula (12), d=0.37, e=0.09, f=0, g=0.46, and h=0.08.

Synthesis Example 10

The same synthesis procedure was performed as in Synthesis Example 8 except that 3.7 g (28.8 mmol) of Compound 7 was used in place of Compound 6, to obtain Polymer compound (A-10).

The molecular weight of this polymer compound was measured by GPC, and consequently the weight average molecular weight was 41,000 in terms of polystyrene. Further, it was confirmed by $^1$HNMR spectroscopic analysis that each component was introduced into the polymer. Also, it was found that in the formula (12), d=0.37, e=0.09, f=0, g=0.46, and h=0.08.

[Preparation of Positive Photosensitive Resin Composition]

Polymer compounds (A-1) to (A-10) synthesized by the above-mentioned Synthesis Examples 1 to 10 were used.

Each of the polymer compounds was blended with (B) a photosensitive material, (C) crosslinker, and cyclopentanone as the additional solvent, with the composition and the blending ratio as shown in Tables 1 and 2, to prepare the positive photosensitive resin composition with a concentration of 45% by mass in terms of the resin. Thereafter, the composition was stirred, mixed, dissolved, and then filtrated through a 0.5 m filter made of Teflon (registered trade mark) for microfiltration to obtain respective Positive photosensitive resin compositions 1 to 28.

TABLE 1

| Positive photosensitive resin composition | (A) Polymer compound | (B) Photosensitive material | (C) Crosslinker | | |
|---|---|---|---|---|---|
| Positive photosensitive resin composition 1 | A-1 (100 parts by mass) | B-38' (15 parts by mass) | C-22 (5 parts by mass) | C-12 (15 parts by mass) | — |
| Positive photosensitive resin composition 2 | A-2 (100 parts by mass) | B-38' (15 parts by mass) | C-22 (5 parts by mass) | C-12 (15 parts by mass) | — |
| Positive photosensitive resin composition 3 | A-3 (100 parts by mass) | B-38' (15 parts by mass) | C-22 (5 parts by mass) | C-12 (15 parts by mass) | — |
| Positive photosensitive resin composition 4 | A-4 (100 parts by mass) | B-38' (15 parts by mass) | C-22 (5 parts by mass) | C-12 (15 parts by mass) | — |
| Positive photosensitive resin composition 5 | A-5 (100 parts by mass) | B-38' (15 parts by mass) | C-22 (5 parts by mass) | C-12 (15 parts by mass) | — |
| Positive photosensitive resin composition 6 | A-6 (100 parts by mass) | B-38' (15 parts by mass) | C-22 (5 parts by mass) | C-12 (15 parts by mass) | — |
| Positive photosensitive resin composition 7 | A-7 (100 parts by mass) | B-38' (15 parts by mass) | C-22 (5 parts by mass) | C-12 (15 parts by mass) | — |
| Positive photosensitive resin composition 8 | A-8 (100 parts by mass) | B-38' (15 parts by mass) | C-22 (5 parts by mass) | C-12 (15 parts by mass) | — |
| Positive photosensitive resin composition 9 | A-9 (100 parts by mass) | B-38' (15 parts by mass) | C-22 (5 parts by mass) | C-12 (15 parts by mass) | — |
| Positive photosensitive resin composition 10 | A-10 (100 parts by mass) | B-38' (15 parts by mass) | C-22 (5 parts by mass) | C-12 (15 parts by mass) | — |
| Positive photosensitive resin composition 11 | A-2 (100 parts by mass) | B-3' (15 parts by mass) | C-22 (5 parts by mass) | C-12 (15 parts by mass) | — |
| Positive photosensitive resin composition 12 | A-2 (100 parts by mass) | B-33' (15 parts by mass) | C-22 (5 parts by mass) | C-12 (15 parts by mass) | — |
| Positive photosensitive resin composition 13 | A-2 (100 parts by mass) | B-34' (15 parts by mass) | C-22 (5 parts by mass) | C-12 (15 parts by mass) | — |
| Positive photosensitive resin composition 14 | A-7 (100 parts by mass) | B-38' (15 parts by mass) | C-22 (20 parts by mass) | — | — |

TABLE 2

| Positive photosensitive resin composition | (A) Polymer compound | (B) Photosensitive material | (C) Crosslinker | | |
|---|---|---|---|---|---|
| Positive photosensitive resin composition 15 | A-7 (100 parts by mass) | B-38' (15 parts by mass) | C-22 (5 parts by mass) | C-3 (15 parts by mass) | — |
| Positive photosensitive resin composition 16 | A-7 (100 parts by mass) | B-38' (15 parts by mass) | C-22 (5 parts by mass) | C-4 (15 parts by mass) | — |
| Positive photosensitive resin composition 17 | A-7 (100 parts by mass) | B-38' (15 parts by mass) | C-22 (5 parts by mass) | C-5 (15 parts by mass) | — |
| Positive photosensitive resin composition 18 | A-7 (100 parts by mass) | B-38' (15 parts by mass) | C-22 (5 parts by mass) | C-6 (15 parts by mass) | — |
| Positive photosensitive resin composition 19 | A-7 (100 parts by mass) | B-38' (15 parts by mass) | C-22 (5 parts by mass) | C-7 (15 parts by mass) | — |
| Positive photosensitive resin composition 20 | A-7 (100 parts by mass) | B-38' (15 parts by mass) | C-22 (5 parts by mass) | C-8 (15 parts by mass) | — |
| Positive photosensitive resin composition 21 | A-7 (100 parts by mass) | B-38' (15 parts by mass) | C-22 (5 parts by mass) | C-9 (15 parts by mass) | — |
| Positive photosensitive resin composition 22 | A-7 (100 parts by mass) | B-38' (15 parts by mass) | C-22 (5 parts by mass) | C-10 (15 parts by mass) | — |
| Positive photosensitive resin composition 23 | A-7 (100 parts by mass) | B-38' (15 parts by mass) | C-22 (5 parts by mass) | C-13 (15 parts by mass) | — |

TABLE 2-continued

| Positive photosensitive resin composition | (A) Polymer compound | (B) Photosensitive material | (C) Crosslinker | | |
|---|---|---|---|---|---|
| Positive photosensitive resin composition 24 | A-7 (100 parts by mass) | B-38' (15 parts by mass) | C-22 (5 parts by mass) | C-14 (15 parts by mass) | — |
| Positive photosensitive resin composition 25 | A-7 (100 parts by mass) | B-38' (15 parts by mass) | C-22 (5 parts by mass) | C-12 (15 parts by mass) | C-15 (15 parts by mass) |
| Positive photosensitive resin composition 26 | A-7 (100 parts by mass) | B-38' (15 parts by mass) | C-22 (5 parts by mass) | C-12 (15 parts by mass) | C-21 (5 parts by mass) |
| Positive photosensitive resin composition 27 | A-7 (100 parts by mass) | B-38' (15 parts by mass) | C-22 (5 parts by mass) | C-5 (15 parts by mass) | C-21 (5 parts by mass) |
| Positive photosensitive resin composition 28 | A-7 (100 parts by mass) | B-38' (15 parts by mass) | C-22 (5 parts by mass) | C-9 (15 parts by mass) | C-21 (5 parts by mass) |

Photosensitive materials (B-3'), (B-33'), (B-38'), and (B-34') of the component (B) listed in Tables 1 and 2 are shown below,

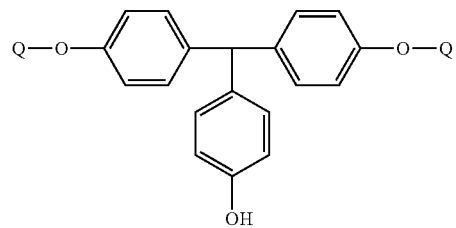
(B-3')

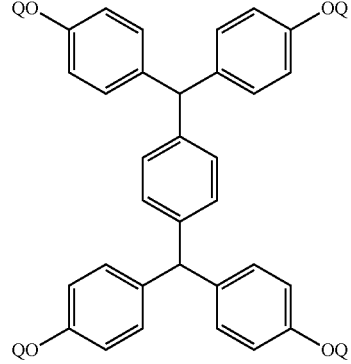
(B-34')

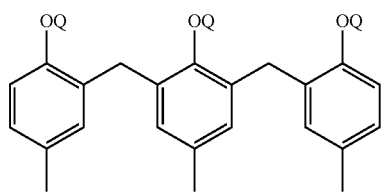
(B-33')

wherein, Q represents a 1,2-naphthoquinone diazide sulfonyl group shown by the formula (17) or a hydrogen atom, with the proviso that 90% of Q is a 1,2-naphthoquinone diazide sulfonyl group shown by the formula (17).

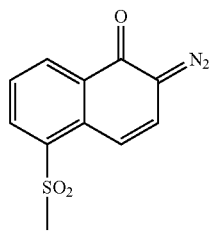
(17)

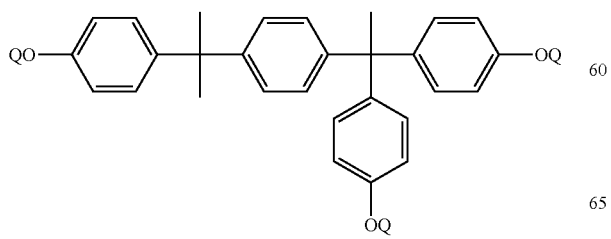
(B-38')

Also, Crosslinkers (C-3) to (C-10), (C-12) to (C-15), (C-21), and (C-22) of the component (C) listed in Tables 1 and 2 are shown below.

(C-22)
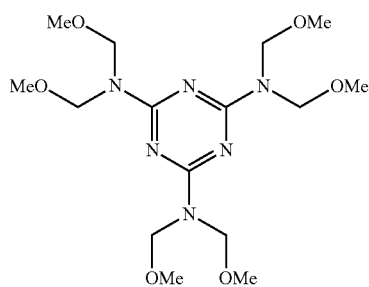
(C-6)
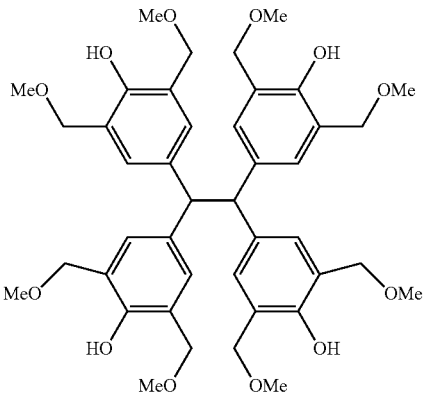
(C-3)
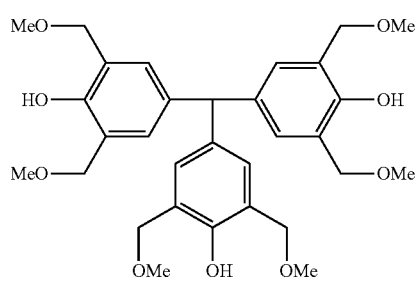
(C-7)
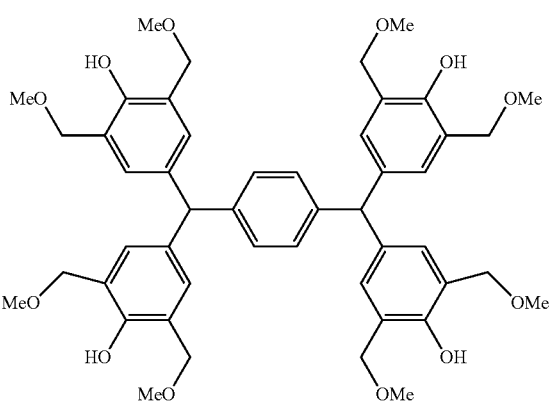
(C-4)
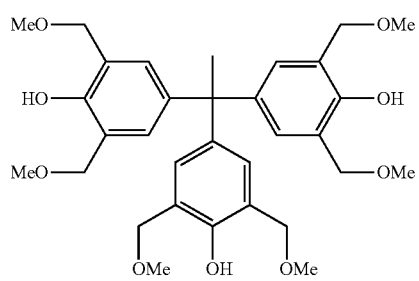
(C-8)
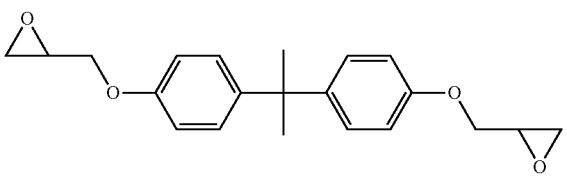
(C-5)
(C-9)
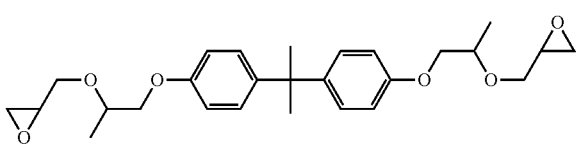
(C-10)
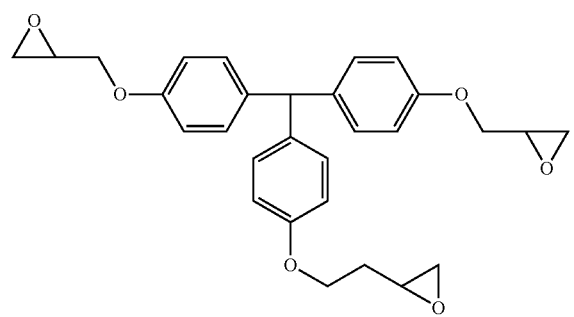

-continued

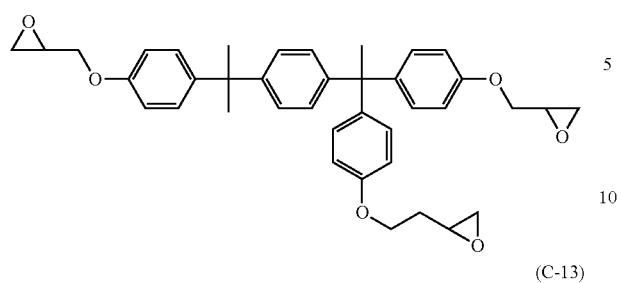

(C-12)

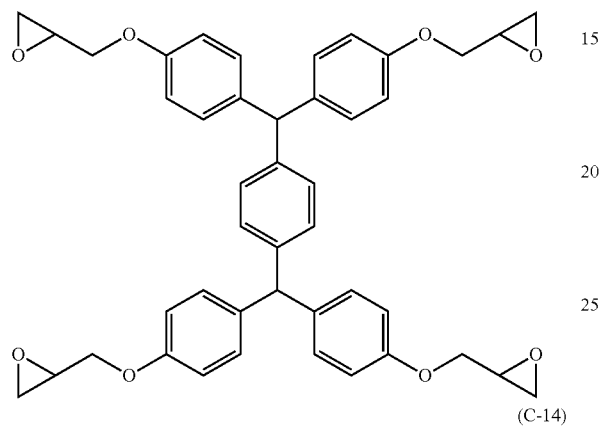

(C-13)

(C-14)

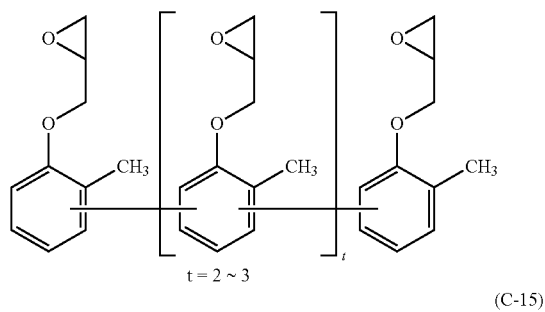

t = 2 ~ 3

(C-15)

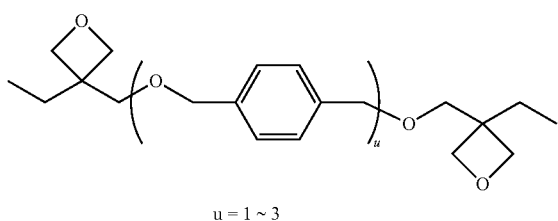

u = 1 ~ 3

-continued

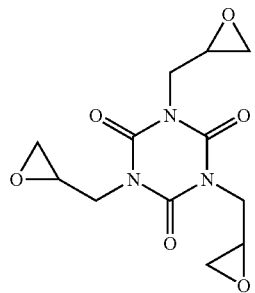

(C-21)

[Applying by a Spin Coating Method, Exposure, and Patterning]

5 mL of each Positive photosensitive resin compositions 1 to 28 prepared as mentioned above was dispensed on a silicon substrate, and then applied by a spin coating method so as to give a film thickness of 20 μm. Then, pre-bake was carried out on a hot plate at 100° C. for 2 minutes.

Subsequently, this substrate was mounted with a mask capable of forming 20 μm holes arranged in 1:1 lengthwise and breadthwise, and was exposed to a broad band light by using Mask Aligner MA-8 (manufactured by SUSS Micro Tec AG). Thereafter, patterning was carried out by repeating one-minute puddle development three times by using a 2.38% TMAH aqueous solution as a developer. Then, the pattern formed on the substrate was post-cured by using an oven at 180° C. for 2 hours while purging therein with nitrogen.

In a similar manner, a pattern is respectively formed on a SiN substrate and on a Cu substrate in place of the silicon substrate by using respective Positive photosensitive resin compositions 1 to 28 prepared as mentioned above.

Next, each substrate was cut-out so that the shape of the obtained hole pattern can be observed. The shape of the hole pattern was observed by using a scanning electron microscope (SEM). The optimum exposure dose (converted to an exposure dose of 365 nm light) to give an aperture diameter of the hole pattern equal to the mask size of 20 μm is shown in Tables 3 and 4. The observed shape is also shown in Tables 3 and 4.

TABLE 3

| Examples | Positive photosensitive resin composition | Pattern profile and exposure dose on silicon substrate (mJ) | Pattern profile and exposure dose on SiN substrate (mJ) | Pattern profile and exposure dose on Cu substrate (mJ) |
| --- | --- | --- | --- | --- |
| Example 1 | Positive photosensitive resin composition 1 | Forward tapered 300 mJ | Forward tapered 360 mJ | Forward tapered 320 mJ |
| Example 2 | Positive photosensitive resin composition 2 | Forward tapered 500 mJ | Forward tapered 540 mJ | Forward tapered 500 mJ |
| Example 3 | Positive photosensitive resin composition 3 | Forward tapered 440 mJ | Forward tapered 500 mJ | Forward tapered 460 mJ |

TABLE 3-continued

| Examples | Positive photosensitive resin composition | Pattern profile and exposure dose on silicon substrate (mJ) | Pattern profile and exposure dose on SiN substrate (mJ) | Pattern profile and exposure dose on Cu substrate (mJ) |
|---|---|---|---|---|
| Example 4 | Positive photosensitive resin composition 4 | Forward tapered 500 mJ | Forward tapered 540 mJ | Forward tapered 500 mJ |
| Example 5 | Positive photosensitive resin composition 5 | Forward tapered 480 mJ | Forward tapered 540 mJ | Forward tapered 500 mJ |
| Example 6 | Positive photosensitive resin composition 6 | Forward tapered 540 mJ | Forward tapered 560 mJ | Forward tapered 540 mJ |
| Example 7 | Positive photosensitive resin composition 7 | Forward tapered 540 mJ | Forward tapered 580 mJ | Forward tapered 540 mJ |
| Example 8 | Positive photosensitive resin composition 8 | Forward tapered 520 mJ | Forward tapered 560 mJ | Forward tapered 520 mJ |
| Example 9 | Positive photosensitive resin composition 9 | Forward tapered 560 mJ | Forward tapered 580 mJ | Forward tapered 560 mJ |
| Example 10 | Positive photosensitive resin composition 10 | Forward tapered 540 mJ | Forward tapered 560 mJ | Forward tapered 520 mJ |
| Example 11 | Positive photosensitive resin composition 11 | Forward tapered 540 mJ | Forward tapered 600 mJ | Forward tapered 560 mJ |
| Example 12 | Positive photosensitive resin composition 12 | Forward tapered 540 mJ | Forward tapered 600 mJ | Forward tapered 560 mJ |
| Example 13 | Positive photosensitive resin composition 13 | Forward tapered 620 mJ | Forward tapered 640 mJ | Forward tapered 620 mJ |
| Example 14 | Positive photosensitive resin composition 14 | Forward tapered 600 mJ | Forward tapered 640 mJ | Forward tapered 600 mJ |

TABLE 4

| Examples | Positive photosensitive resin composition | Pattern profile and exposure dose on silicon substrate (mJ) | Pattern profile and exposure dose on SiN substrate (mJ) | Pattern profile and exposure dose on Cu substrate (mJ) |
|---|---|---|---|---|
| Example 15 | Positive photosensitive resin composition 15 | Forward tapered 540 mJ | Forward tapered 540 mJ | Forward tapered 540 mJ |
| Example 16 | Positive photosensitive resin composition 16 | Forward tapered 560 mJ | Forward tapered 580 mJ | Forward tapered 560 mJ |
| Example 17 | Positive photosensitive resin composition 17 | Forward tapered 480 mJ | Forward tapered 520 mJ | Forward tapered 480 mJ |
| Example 18 | Positive photosensitive resin composition 18 | Forward tapered 480 mJ | Forward tapered 500 mJ | Forward tapered 480 mJ |
| Example 19 | Positive photosensitive resin composition 19 | Forward tapered 520 mJ | Forward tapered 560 mJ | Forward tapered 520 mJ |
| Example 20 | Positive photosensitive resin composition 20 | Forward tapered 540 mJ | Forward tapered 560 mJ | Forward tapered 540 mJ |
| Example 21 | Positive photosensitive resin composition 21 | Forward tapered 540 mJ | Forward tapered 540 mJ | Forward tapered 540 mJ |
| Example 22 | Positive photosensitive resin composition 22 | Forward tapered 540 mJ | Forward tapered 560 mJ | Forward tapered 560 mJ |
| Example 23 | Positive photosensitive resin composition 23 | Forward tapered 560 mJ | Forward tapered 560 mJ | Forward tapered 560 mJ |

TABLE 4-continued

| Examples | Positive photosensitive resin composition | Pattern profile and exposure dose on silicon substrate (mJ) | Pattern profile and exposure dose on SiN substrate (mJ) | Pattern profile and exposure dose on Cu substrate (mJ) |
|---|---|---|---|---|
| Example 24 | Positive photosensitive resin composition 24 | Forward tapered 560 mJ | Forward tapered 560 mJ | Forward tapered 560 mJ |
| Example 25 | Positive photosensitive resin composition 25 | Forward tapered 500 mJ | Forward tapered 540 mJ | Forward tapered 500 mJ |
| Example 26 | Positive photosensitive resin composition 26 | Forward tapered 540 mJ | Forward tapered 560 mJ | Forward tapered 520 mJ |
| Example 27 | Positive photosensitive resin composition 27 | Forward tapered 640 mJ | Forward tapered 640 mJ | Forward tapered 640 mJ |
| Example 28 | Positive photosensitive resin composition 28 | Forward tapered 640 mJ | Forward tapered 640 mJ | Forward tapered 640 mJ |

As shown in Tables 3 and 4, Positive photosensitive resin compositions 1 to 28 of the present invention could form patterns by using a 2.38% TMAH aqueous solution as a developer. Moreover, the pattern profiles of Positive photosensitive resin compositions 1 to 28 were forward tapered, that is, very good pattern shapes could be obtained. Further, delamination did not occur even in the substrates such as SiN substrate and Cu substrate, which undergo delamination readily during development.

[Preparation of Photo-Curable Dry Film]

For photo-curable dry film, Polymer compounds (A-1) to (A-10) each synthesized in Synthesis Examples 1 to 10, were blended with (B) a photosensitive material and (C) a crosslinker, with the composition and the blending ratio as shown in Tables 1 and 2, in the same manner as above, except using no additional cyclopentanone. Thereafter, they were stirred, mixed, dissolved, and then filtrated through a 1.0 μm filter made of Teflon (registered trade mark) for microfiltration to obtain respective Positive photosensitive resin compositions 1' to 10'.

By using a die coater as a film coater and a polyethylene terephthalate film (thickness of 38 μm) as a supporting film, Positive photosensitive resin composition 1' to 10' were respectively applied onto the supporting film so as to give a thickness of 50 μm. Then, each was passed through a hot-air circulating oven (length of 4 m) at 100° C. over 5 minutes to form a photo-curable resin layer on the supporting film. Thereafter, a polyethylene film (thickness of 50 μm) was laminated as a top coat film onto the photo-curable resin layer by using a laminate roll under pressure of 1 MPa to obtain Photo-curable dry films 1 to 10.

[Adhesion of Photo-Curable Dry Film, Exposure, and Patterning]

The top coat film of respective Photo-curable dry films 1 to 10 obtained as mentioned above was delaminated. Then, the photo-curable resin layer on the supporting film was adhered onto a silicon substrate at 100° C. by using a vacuum laminator TEAM-100RF (manufactured by Takatori Corp.) with a vacuum degree in the vacuum chamber of 100 Pa. After the pressure was resumed to a normal pressure, the substrate was cooled to 25° C., taken out from the vacuum laminator, and then, the supporting film was delaminated. After delamination of the supporting film, pre-bake was carried out on a hot plate at 100° C. for 5 minutes.

Then, this substrate was mounted with a mask capable of forming 40 μm holes arranged in 1:1 lengthwise and breadthwise, and was exposed to a broad band light by using Mask Aligner MA-8 (manufactured by SUSS Micro Tec AG). Thereafter, patterning was carried out by repeating one-minute puddle development five times by using a 2.38% TMAH aqueous solution as a developer. Then, the pattern formed on the substrate was post-cured by using an oven at 180° C. for 2 hours while purging therein with nitrogen.

In a similar manner, a pattern is respectively formed on a SiN substrate and on a Cu substrate in place of the silicon substrate by using respective Photo-curable dry films 1 to 10 produced as mentioned above.

Next, each substrate was cut-out so that the shape of the obtained hole pattern can be observed. The shape of the hole pattern was observed by using a scanning electron microscope (SEM). The optimum exposure dose (converted to an exposure dose of 365 nm light) to give an aperture diameter of the hole pattern equal to the mask size of 40 μm is shown in Table 5. The observed shape is also shown in Table 5.

TABLE 5

| Examples | Photo-curable dry film | Pattern profile and exposure dose on silicon substrate (mJ) | Pattern profile and exposure dose on SiN substrate (mJ) | Pattern profile and exposure dose on Cu substrate (mJ) |
|---|---|---|---|---|
| Example 29 | Photo-curable dry film 1 | Forward tapered 360 mJ | Forward tapered 420 mJ | Forward tapered 400 mJ |
| Example 30 | Photo-curable dry film 2 | Forward tapered 540 mJ | Forward tapered 580 mJ | Forward tapered 580 mJ |

TABLE 5-continued

| Examples | Photo-curable dry film | Pattern profile and exposure dose on silicon substrate (mJ) | Pattern profile and exposure dose on SiN substrate (mJ) | Pattern profile and exposure dose on Cu substrate (mJ) |
| --- | --- | --- | --- | --- |
| Example 31 | Photo-curable dry film 3 | Forward tapered 500 mJ | Forward tapered 540 mJ | Forward tapered 500 mJ |
| Example 32 | Photo-curable dry film 4 | Forward tapered 520 mJ | Forward tapered 580 mJ | Forward tapered 540 mJ |
| Example 33 | Photo-curable dry film 5 | Forward tapered 540 mJ | Forward tapered 600 mJ | Forward tapered 580 mJ |
| Example 34 | Photo-curable dry film 6 | Forward tapered 600 mJ | Forward tapered 600 mJ | Forward tapered 600 mJ |
| Example 35 | Photo-curable dry film 7 | Forward tapered 580 mJ | Forward tapered 640 mJ | Forward tapered 580 mJ |
| Example 36 | Photo-curable dry film 8 | Forward tapered 580 mJ | Forward tapered 620 mJ | Forward tapered 560 mJ |
| Example 37 | Photo-curable dry film 9 | Forward tapered 600 mJ | Forward tapered 640 mJ | Forward tapered 600 mJ |
| Example 38 | Photo-curable dry film 10 | Forward tapered 580 mJ | Forward tapered 640 mJ | Forward tapered 580 mJ |

As shown in Table 5, the photo-curable dry films using the positive photosensitive resin composition of the present invention could form patterns by using a 2.38% TMAH aqueous solution as a developer. Moreover, the pattern profiles thereof were excellent, and delamination did not occur substantially even in the substrates such as SiN and Cu, which undergo delamination readily during development.

[Fill-Up Performance Test of Photo-Curable Dry Film]

A 6-inch (150 mm diameter) silicon wafer having 200 circular holes each having an aperture diameter of 10 to 100 μm (pitch of 10 μm) and a depth of 10 to 120 μm (pitch of 10 μm) was prepared as the substrate. Each top coat film of respective Photo-curable dry films 2, 3, 4, 5, 7 and 10 was delaminated, and then, the photo-curable resin layer on the supporting film was adhered onto the prepared substrate at 100° C. by using a vacuum laminator TEAM-100RF (manufactured by Takatori Corp.) with a vacuum degree in the vacuum chamber of 100 Pa. After the pressure was resumed to a normal pressure, the substrate was cooled to 25° C., taken out from the vacuum laminator, and then, the supporting film was delaminated. After delamination of the supporting film, pre-bake was carried out on a hot plate at 100° C. for 5 minutes.

Then, the substrate was exposed to a broad band light with the exposure dose (365 nm wavelength) shown in Table 6 by using Mask Aligner MA-8 (manufactured by SUSS Micro Tec AG). Thereafter, one-minute puddle development was repeated five times by using a 2.38% TMAH aqueous solution as a developer. Then, the pattern formed on the substrate was post-cured by using an oven at 180° C. for 2 hours while purging therein with nitrogen.

Each of the substrates thus obtained was diced to expose the cross section of the circular holes, and the cross section of the circular holes was observed by using a scanning electron microscope (SEM) to evaluate the fill-up performance and whether or not defects were present. The results are shown in Table 6.

TABLE 6

| Examples | Photo-curable dry film | Exposure dose (mJ) | Observation result of circular hole cross section |
| --- | --- | --- | --- |
| Example 39 | Photo-curable dry film 2 | 600 mJ | No defect Excellent fill-up |
| Example 40 | Photo-curable dry film 3 | 600 mJ | No defect Excellent fill-up |
| Example 41 | Photo-curable dry film 4 | 600 mJ | No defect Excellent fill-up |
| Example 42 | Photo-curable dry film 5 | 600 mJ | No defect Excellent fill-up |
| Example 43 | Photo-curable dry film 7 | 600 mJ | No defect Excellent fill-up |
| Example 44 | Photo-curable dry film 10 | 600 mJ | No defect Excellent fill-up |

As shown in Table 6, all the circular holes of the silicon wafer having the photo-curable dry film of the present invention adhered thereto were filled up without defect, and thus, the fill-up performance of the photo-curable dry film of the present invention as a top coat to protect electric and electronic parts was excellent.

[Test of Electric Characteristics (Dielectric Breakdown Strength) of Photo-Curable Dry Film]

Each top coat film of respective Photo-curable dry films 2, 3, 4, 5, 7 and 10 was delaminated, and then, the photo-curable resin layer on the supporting film was adhered onto a substrate defined in JIS K 6249 at 100° C. After the substrate was cooled to room temperature, the supporting film was delaminated, and pre-bake was then carried out on a hot plate at 100° C. for 5 minutes.

Then, the substrate was exposed to a broad band light with an exposure dose of 1,000 mJ/cm$^2$ (365 nm wavelength) by using the above-mentioned mask aligner via a quartz photomask. Thereafter, one-minute puddle development was repeated 5 times by using a 2.38% TMAH aqueous solution as a developer. Then, post-cure was carried out by using an oven at 180° C. for 2 hours while purging therein with nitrogen to obtain a substrate for measurement of dielectric breakdown strength. The dielectric breakdown strength of the substrate thus obtained was measured in accordance with the measurement method defined in JIS K 6249. The results are shown in Table 7.

[Test of Adhesion and Chemical Resistance of Photo-Curable Dry Film]

Each top coat film of respective Photo-curable dry films 2, 3, 4, 5, 7 and 10 was delaminated, and then, the photo-curable resin layer on the supporting film was adhered onto an untreated 6-inch (150 mm diameter) silicon wafer (substrate) at 100° C. by using the above-mentioned vacuum laminator with a vacuum degree in the vacuum chamber of 100 Pa. After the pressure was resumed to a normal pressure, the substrate was cooled to 25° C., taken out from the vacuum laminator, and then, the supporting film was delaminated. After delamination of the supporting film, pre-bake was carried out on a hot plate at 100° C. for 5 minutes.

Then, the substrate was exposed to a broad band light with an exposure dose of 1,000 mJ/cm$^2$ (365 nm wavelength) by using the above-mentioned mask aligner via a quartz photomask. Thereafter, one-minute puddle development was repeated 5 times by using a 2.38% TMAH aqueous solution as a developer. Subsequently, post-cure was carried out by using an oven at 180° C. for 2 hours while purging therein with nitrogen to obtain a post-pattern cured film with a diameter of 300 μm and a height of 50 μm.

The resistance applied when the post-pattern cured film was delaminated from the substrate was measured by a bond tester Dage Series 4000-PXY (manufactured by Nordson Dage Corp.) to evaluate initial adhesiveness thereof. The measurement was performed under conditions that measurement speed was 50.0 μm/second and the measurement height was 3.0 μm.

FIG. 1 is an explanatory view of the method for measuring adhesiveness. In FIG. 1, reference number 1 denotes a silicon wafer (substrate), 2 denotes a post-pattern cured film, 3 denotes a measurement jig of a bond tester, and 4 denotes a moving direction of the measurement jig. The obtained value is an average of 15 measurement points, in which the higher the value, the higher the adhesion strength of the post-pattern cured film to the substrate.

Then, a soldering flux liquid was applied to the post-pattern cured film on the substrate, and heated at 220° C. for 30 seconds. After the substrate was cooled, it was washed with pure water, and then dried at room temperature for 2 hours. By using this dried post-pattern cured film, the resistance applied when the pattern was delaminated from the substrate was measured with the above-mentioned bond tester to evaluate adhesiveness after deterioration in the same manner as the initial adhesiveness.

Meanwhile, adhesiveness of six photo-curable dry films was evaluated by comparing these initial values. Also, by comparing behavior of decrease in the values from the initial to the after deterioration, chemical resistance to the soldering flux liquid was evaluated as well as the adhesiveness. The results are shown in Table 7.

[Test of Crack Resistance of Photo-Curable Dry Film]

Each top coat film of respective Photo-curable dry films 2, 3, 4, 5, 7 and 10 was delaminated, and then, the photo-curable resin layer on the supporting film was adhered onto a 6-inch (150 mm diameter) silicon wafer (substrate), which is the same wafer as used in the fill-up performance test mentioned above, at 1000° C. by using the above-mentioned vacuum laminator with a vacuum degree in the vacuum chamber of 100 Pa. After the pressure was resumed to a normal pressure, the substrate was cooled to 25° C., taken out from the vacuum laminator, and then, the supporting film was delaminated. After delamination of the supporting film, pre-bake was carried out on a hot plate at 100° C. for 5 minutes.

Then, the substrate was exposed to a broad band light with an exposure dose of 1,000 mJ/cm$^2$ (365 nm wavelength) by using the above-mentioned mask aligner via a quartz photomask. Thereafter, one-minute puddle development was repeated 5 times by using a 2.38% TMAH aqueous solution as a developer. Subsequently, post-cure was carried out by using an oven at 180° C. for 2 hours while purging therein with nitrogen.

This substrate having the cured film formed thereon was put into a thermal cycle tester with a temperature profile of −55° C. to +150° C. as one cycle, and performed for 1,000 cycles to examine whether or not a crack was formed in the cured film. The results are shown in Table 7.

[Resistance of Photo-Curable Dry Film to Removing Liquid]

Each top coat film of respective Photo-curable dry films 2, 3, 4, 5, 7 and 10 was delaminated, and then, the photo-curable resin layer on the supporting film was adhered onto an untreated 6-inch (150 mm diameter) silicon wafer (substrate) at 100° C. by using the above-mentioned vacuum laminator with a vacuum degree in the vacuum chamber of 100 Pa. After the pressure was resumed to a normal pressure, the substrate was cooled to 25° C., taken out from the vacuum laminator, and then, the supporting film was delaminated. After delamination of the supporting film, pre-bake was carried out on a hot plate at 100° C. for 5 minutes.

Then, the substrate was exposed to a broad band light with an exposure dose of 1,000 mJ/cm$^2$ (365 nm wavelength) by using the above-mentioned mask aligner via a quartz photomask. Thereafter, one-minute puddle development was repeated 5 times by using a 2.38% TMAH aqueous solution as a developer. Subsequently, post-cure was carried out by using an oven at 180° C. for 2 hours while purging therein with nitrogen to obtain a 15 mm×15 mm square pattern cured film.

This substrate having the cured film formed thereon was soaked in N-methylpyrrolidone (NMP) at room temperature for 1 hour, and then, the changes in appearance and film thickness were examined to evaluate resistance to the removing liquid. The results are shown in Table 7.

TABLE 7

| Example | Photo-curable dry film | Electric characteristics Dielectric breakdown strength (V/μm) | Adhesiveness Initial (mN) | Adhesiveness After deterioration (mN) | Crack resistance (after thermal cycle test) | Resistance to removing liquid (after soaking in NMP) |
|---|---|---|---|---|---|---|
| Example 39 | Photo-curable dry film 2 | 350 | 330 | 280 | No crack | No change in appearance and film thickness |

TABLE 7-continued

| Example | Photo-curable dry film | Electric characteristics Dielectric breakdown strength (V/μm) | Adhesiveness Initial (mN) | Adhesiveness After deterioration (mN) | Crack resistance (after thermal cycle test) | Resistance to removing liquid (after soaking in NMP) |
|---|---|---|---|---|---|---|
| Example 40 | Photo-curable dry film 3 | 350 | 330 | 280 | No crack | No change in appearance and film thickness |
| Example 41 | Photo-curable dry film 4 | 340 | 350 | 290 | No crack | No change in appearance and film thickness |
| Example 42 | Photo-curable dry film 5 | 350 | 350 | 290 | No crack | No change in appearance and film thickness |
| Example 43 | Photo-curable dry film 7 | 350 | 360 | 280 | No crack | No change in appearance and film thickness |
| Example 44 | Photo-curable dry film 10 | 350 | 340 | 270 | No crack | No change in appearance and film thickness |

As shown in Table 7, the cured film obtained by patterning of the photo-curable dry film of the present invention was excellent all in electric characteristics, adhesiveness, chemical resistance, crack resistance, and resistance to the removing liquid, as a top coat to protect electric and electronic parts.

As mentioned above, the present invention can provide a positive photosensitive resin composition that can dramatically remedy the problem of delamination generated on a metal wiring, an electrode, and a substrate such as Cu and Al, especially on a substrate such as SiN. By using this positive photosensitive resin composition, a fine pattern having a forward tapered shape can be formed without generating a scum and a footing profile in a wide range of wavelength; and in addition, miniaturization of the pattern is possible in the rewiring technology in accordance with the trend to higher density and higher integration of chips. Moreover, this positive photosensitive resin composition can be developed by an aqueous alkaline solution such as a TMAH aqueous solution, thereby providing a photo-curable dry film using the positive photosensitive resin composition, and a patterning process using the photo-curable dry film. When the pattern formed by the patterning process like this is post-cured at low temperature, a substrate protected by a cured film having excellent flexibility, heat resistance, electric characteristics, adhesiveness, reliability, chemical resistance, crack resistance, and fill-up performance can be obtained. That is, the positive photosensitive resin composition of the present invention and the photo-curable dry film using the same can give a top coat suitable to protect electric and electronic parts, a semiconductor device, and the like.

Further, the pattern formed by the positive photosensitive resin composition of the present invention or the photo-curable dry film using the same has excellent resolution, is suitable to form a fine through electrode, and can be formed into a forward tapered shape, which is a suitable shape for a through electrode. Therefore, it is useful to form a fine electrode for connecting circuits and wires.

It must be noted here that the present invention is not limited to the embodiments as described above. The foregoing embodiments are mere examples; any form having substantially the same composition as the technical concept described in claims of the present invention and showing similar effects is included in the technical scope of the present invention.

What is claimed is:

1. A positive photosensitive resin composition comprising:
   (A) a polymer compound containing a carboxyl group and a siloxane chain;
   (B) a photosensitive material capable of generating an acid by light and increasing a dissolution rate in an aqueous alkaline solution;
   (C) one or more crosslinkers selected from an amino condensate modified by formaldehyde or formaldehyde-alcohol, a phenol compound having on average two or more methylol groups or alkoxymethylol groups per molecule, a polyhydric phenol compound in which a hydrogen atom of a phenolic hydroxyl group is substituted by a glycidyl group, a polyhydric phenol compound in which a hydrogen atom of a phenolic hydroxyl group is substituted by a substituent shown by the formula (C-1), and a compound having two or more nitrogen atoms bonded to a glycidyl group per molecule and shown by the formula (C-2); and
   (D) a solvent;
   wherein the component (A) is obtained in the presence of an acid catalyst by condensation of at least a siloxane compound having phenol groups at both terminals and shown by the formula (1), either or both of a phenol compound shown by the formula (2) and a phenol compound shown by the formula (3), and one or more kinds of aldehydes and ketones shown by the formula (4),

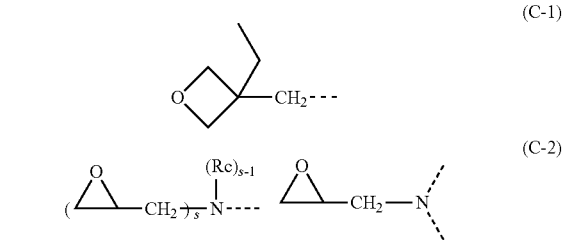

wherein the dotted line represents a bond; $R_c$ represents a linear, branched, or cyclic alkyl group having 1 to 6 carbon atoms; and "s" is 1 or 2,

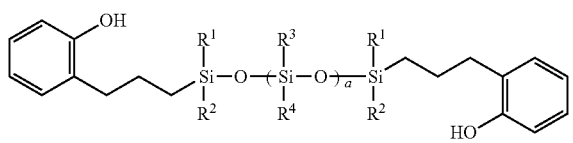
(1)

wherein $R^1$ to $R^4$ represent the same or different monovalent hydrocarbon group having 1 to 8 carbon atoms; and "a" is an integer of 1 to 100,

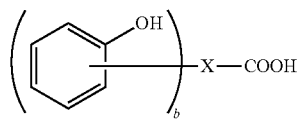
(2)

wherein "b" is 1 or 2; and X represents a divalent organic group when "b" is 1, or X represents a trivalent organic group when "b" is 2, wherein when "b" is 1, the carboxyl group may be directly bonded to the phenol group without intervention of X,

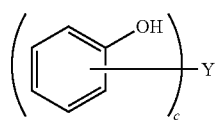
(3)

wherein "c" is 1 or 2; and Y represents a monovalent substituent selected from a hydrogen atom, an alkyl group having 1 to 6 carbon atoms, a hydroxyl group, and a halogen atom when "c" is 1, or Y represents a divalent organic group optionally containing an atom of Si, S, or O when "c" is 2,

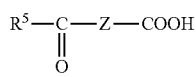
(4)

wherein $R^5$ represents a hydrogen atom or a methyl group; and Z represents an alkylene group having 1 to 12 carbon atoms, or an aromatic group.

2. The positive photosensitive resin composition according to claim 1, wherein the component (A) is obtained in the presence of the acid catalyst by condensation by further adding one or more kinds of aldehydes and ketones shown by the formula (5),

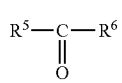
(5)

wherein $R^5$ represents the same meaning as above; and $R^6$ represents a hydrogen atom, an alkyl group having 1 to 15 carbon atoms, or an aromatic group, wherein $R^5$ and $R^6$ may be connected by an alkylene group having 1 to 15 carbon atoms.

3. The positive photosensitive resin composition according to claim 2, wherein one of the aldehydes and the ketones shown by the formula (5) is a compound shown by the formula (11),

(11)

wherein $R^7$ represents a hydrogen atom, an alkyl group having 1 to 6 carbon atoms, or a halogen atom.

4. The positive photosensitive resin composition according to claim 2, wherein one of the aldehydes and the ketones shown by the formula (5) is formaldehyde.

5. The positive photosensitive resin composition according to claim 1, wherein the siloxane compound having phenol groups at both terminals and shown by the formula (1) is a compound shown by the formula (6),

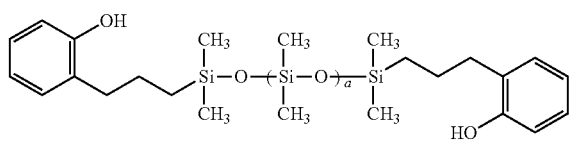
(6)

wherein "a" represents the same meaning as above.

6. The positive photosensitive resin composition according to claim 1, wherein the phenol compound shown by the formula (2) is any of compounds shown by the formulae (7).

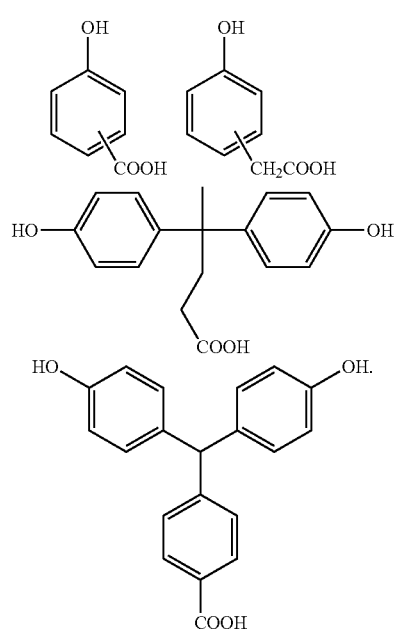
(7)

7. The positive photosensitive resin composition according to claim 1, wherein the phenol compound shown by the formula (3) is a compound shown by the formula (8),

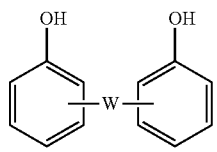
(8)

wherein W represents a divalent organic group having any of structures shown by the formulae (9),

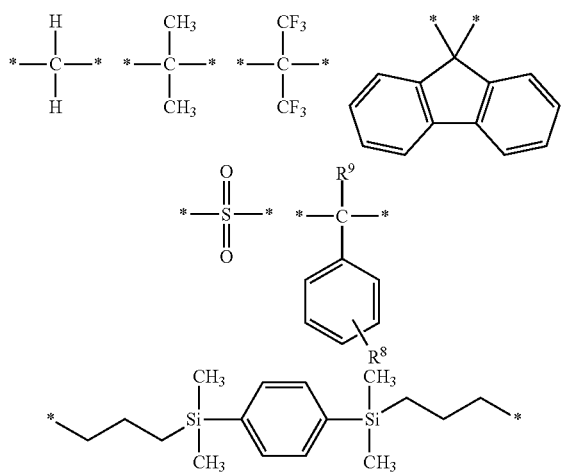
(9)

wherein $R^8$ represents a monovalent substituent selected from a hydrogen atom, an alkyl group having 1 to 6 carbon atoms, a hydroxyl group, and a halogen atom; and $R^9$ represents a hydrogen atom or a methyl group.

8. The positive photosensitive resin composition according to claim 1, wherein one of the aldehydes and the ketones shown by the formula (4) is a compound shown by the formula (10).

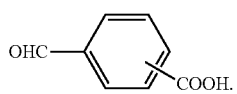
(10)

9. The positive photosensitive resin composition according to claim 1, wherein the component (A) has a repeating unit shown by the formula (12) and weight average molecular weight in the range of 3,000 to 500,000,

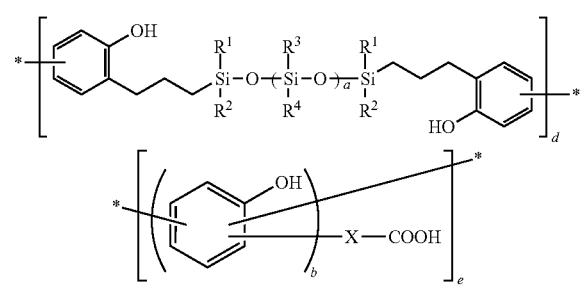
(12)

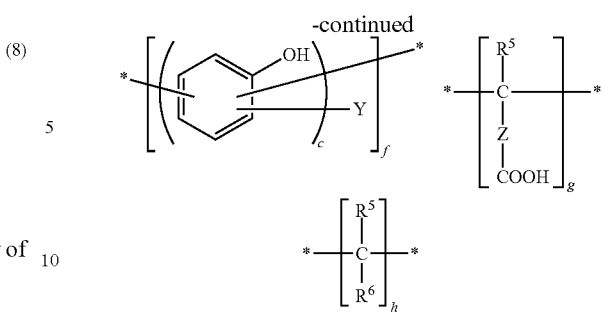

wherein $R^1$ to $R^5$, "a", "b", "c", X, and Y represent the same meanings as above; $R^6$ represents a hydrogen atom, an alkyl group having 1 to 15 carbon atoms, or an aromatic group, wherein $R^5$ and $R^6$ in the group corresponding to "h" in formula (12) may be further connected to each other by an alkylene group having 1 to 15 carbon atoms to form one or more cyclic groups; "d" and "g" represent a positive number; "e", "f", and "h" represent 0 or a positive number; and d+e+f+g+h=1.

10. The positive photosensitive resin composition according to claim 9, wherein in the formula (12), "d" represents $0<d\leq0.5$, "e" represents "g" represents $0<g<0.8$, and "h" represents $0\leq h\leq0.5$.

11. The positive photosensitive resin composition according to claim 1, wherein the component (B) is a compound having a 1,2-naphthoquinone diazide sulfonyl group.

12. A photo-curable dry film comprising a supporting film, a top coat film, and a photo-curable resin layer having a film thickness of 10 to 100 μm, the photo-curable resin layer being sandwiched between the supporting film and the top coat film, wherein the photo-curable resin layer is formed of the positive photosensitive resin composition according to claim 1.

13. A layered product comprising a substrate including a trench and/or a hole each having an aperture width in the range of 10 to 100 μm and a depth in the range of 10 to 120 μm, and the photo-curable resin layer of the photo-curable dry film according to claim 12 laminated on the substrate.

14. A patterning process comprising:
adhering onto a substrate the photo-curable resin layer which becomes exposed by delaminating the top coat film from the photo-curable dry film according to claim 12,
exposing the photo-curable resin layer to a high energy beam having a wavelength of 190 to 500 nm or an electron beam via a photomask under the state of intervention of the supporting film or under the state of the supporting film delaminated, and
development by using a developer.

15. The patterning process according to claim 14, further comprising post-curing a patterned film formed by the development at 100 to 250° C. after the development.

16. The patterning process according to claim 14, wherein the substrate includes a trench and/or a hole each having an aperture width in the range of 10 to 100 μm and a depth in the range of 10 to 120 μm.

17. A substrate which is protected by a film obtained by curing a pattern formed by the patterning process according to claim 14.

18. A method for producing a photo-curable dry film, comprising:
(i) continuously applying the positive photosensitive resin composition according to claim 1 onto a supporting film to form a photo-curable resin layer, (ii) continuously drying the photo-curable resin layer, and further (iii) laminating a top coat film onto the photo-curable resin layer.

19. A patterning process comprising:

applying the positive photosensitive resin composition according to claim 1 onto a substrate to font' a photosensitive resin film, exposing the photosensitive resin film to a high energy beam having a wavelength of 190 to 500 nm or an electron beam via a photomask after heat treatment, and development by using a developer.

20. The patterning process according to claim 19, further comprising post-curing a patterned film formed by the development at 100 to 250° C. after the development.

21. A substrate which is protected by a film obtained by curing a pattern formed by the patterning process according to claim 19.

\* \* \* \* \*